US012347484B2

(12) United States Patent
Tran et al.

(10) Patent No.: US 12,347,484 B2
(45) Date of Patent: Jul. 1, 2025

(54) MEMORY DEVICE OF NON-VOLATILE MEMORY CELLS

(71) Applicants: Silicon Storage Technology, Inc., San Jose, CA (US); The Regents of the University of California, Oakland, CA (US)

(72) Inventors: Hieu Van Tran, San Jose, CA (US); Nhan Do, Saratoga, CA (US); Farnood Merrikh Bayat, Goleta, CA (US); Xinjie Guo, Goleta, CA (US); Dmitri Strukov, Goleta, CA (US); Vipin Tiwari, Dublin, CA (US); Mark Reiten, Alamo, CA (US)

(73) Assignees: Silicon Storage Technology, Inc., San Jose, CA (US); The Regents of the University of California, Oakland, CA (US)

( * ) Notice: Subject to any disclaimer, the term of this patent is extended or adjusted under 35 U.S.C. 154(b) by 82 days.

(21) Appl. No.: 18/141,090

(22) Filed: Apr. 28, 2023

(65) Prior Publication Data

US 2023/0259738 A1 Aug. 17, 2023

Related U.S. Application Data

(63) Continuation of application No. 17/580,862, filed on Jan. 21, 2022, now Pat. No. 12,300,313, which is a (Continued)

(51) Int. Cl.
*G11C 11/54* (2006.01)
*G06F 3/06* (2006.01)
(Continued)

(52) U.S. Cl.
CPC .............. *G11C 11/54* (2013.01); *G06F 3/061* (2013.01); *G06F 3/0655* (2013.01);
(Continued)

(58) Field of Classification Search
CPC ......... G11C 11/54; G11C 16/08; G11C 16/12; G11C 16/16; G11C 16/3436; G11C 29/38;
(Continued)

(56) References Cited

U.S. PATENT DOCUMENTS 4,810,910 A 3/1989 Schoellikopf
4,904,881 A 2/1990 Castro
(Continued)

FOREIGN PATENT DOCUMENTS

CN 102567784 7/2012
CN 102906767 1/2013
(Continued)

OTHER PUBLICATIONS

U.S. Appl. No. 16/382,034 entitled "Neural Network Classifier Using Array Of Four-Gate Non-volatile Memory Cells," Tran, et al, filed Apr. 11, 2019.
(Continued)

*Primary Examiner* — Vanthu T Nguyen
(74) *Attorney, Agent, or Firm* — DLA Piper LLP (US)

(57) ABSTRACT

A memory device includes a non-volatile memory cells, source regions and drain regions arranged in rows and columns. Respective ones of the columns of drain regions include first drain regions and second drain regions that alternate with each other. Respective ones of first lines electrically connect together the source regions in one of the rows of the source regions and are electrically isolated from the source regions in other rows of the source regions. Respective ones of second lines electrically connect together
(Continued)

the first drain regions of one of the columns of drain regions and are electrically isolated from the second drain regions of the one column of drain regions. Respective ones of third lines electrically connect together the second drain regions of one of the columns of drain regions and are electrically isolated from the first drain regions of the one column of drain regions.

20 Claims, 31 Drawing Sheets

Related U.S. Application Data continuation of application No. 15/594,439, filed on May 12, 2017, now Pat. No. 11,308,383.

(60) Provisional application No. 62/337,760, filed on May 17, 2016.

(51) Int. Cl.
| | | |
|---|---|---|
| *G06N 3/04* | (2023.01) | |
| *G06N 3/045* | (2023.01) | |
| *G06N 3/063* | (2023.01) | |
| *G11C 16/08* | (2006.01) | |
| *G11C 16/12* | (2006.01) | |
| *G11C 16/16* | (2006.01) | |
| *G11C 16/34* | (2006.01) | |
| *G11C 29/38* | (2006.01) | |

(52) U.S. Cl.
CPC .............. *G06F 3/0688* (2013.01); *G06N 3/04* (2013.01); *G06N 3/045* (2023.01); *G06N 3/063* (2013.01); *G11C 16/08* (2013.01); *G11C 16/12* (2013.01); *G11C 16/16* (2013.01); *G11C 16/3436* (2013.01); *G11C 29/38* (2013.01)

(58) Field of Classification Search
CPC .......... G06N 3/045; G06N 3/04; G06N 3/063; G06F 3/061; G06F 3/0655; G06F 3/0688
See application file for complete search history.

(56) References Cited

U.S. PATENT DOCUMENTS

| | | | |
|---|---|---|---|
| 4,950,917 A | 8/1990 | Holler | |
| 4,961,002 A | 10/1990 | Tam | |
| 5,028,810 A | 7/1991 | Castro | |
| 5,029,130 A | 7/1991 | Yeh | |
| 5,055,897 A | 10/1991 | Canepa | |
| 5,097,441 A | 3/1992 | Cho | |
| 5,138,576 A | 8/1992 | Madurawe | |
| 5,146,602 A | 9/1992 | Holler | |
| 5,150,450 A | 9/1992 | Swenson | |
| 5,242,848 A | 9/1993 | Yeh | |
| 5,256,911 A | 10/1993 | Holler | |
| 5,264,734 A | 11/1993 | Holler | |
| 5,298,796 A | 3/1994 | Tawel | |
| 5,336,936 A | 8/1994 | Allen | |
| 5,386,132 A | 1/1995 | Wong | |
| 5,469,397 A | 11/1995 | Hoshino | |
| 5,509,106 A | 4/1996 | Pechanek | |
| 5,554,874 A | 9/1996 | Doluca | |
| 5,621,336 A | 4/1997 | Shibata | |
| 5,643,814 A | 7/1997 | Chung | |
| 5,721,702 A | 2/1998 | Briner | |
| 5,748,534 A | 5/1998 | Dunlap | |
| 5,914,894 A | 6/1999 | Diorio | |
| 5,966,332 A | 10/1999 | Takano | |
| 5,990,512 A | 11/1999 | Diorio | |
| 6,144,584 A * | 11/2000 | Kunori | .................. H10B 69/00 |
| | | | 365/185.23 |
| 6,222,777 B1 | 4/2001 | Khieu | |
| 6,232,180 B1 | 5/2001 | Chen | |
| 6,282,119 B1 | 8/2001 | Tsen | |
| 6,389,404 B1 | 5/2002 | Carson | |
| 6,683,645 B1 | 1/2004 | Collins | |
| 6,747,310 B2 | 6/2004 | Fan | |
| 6,829,598 B2 | 12/2004 | Miley | |
| 7,315,056 B2 | 1/2008 | Klinger | |
| 7,663,916 B2 * | 2/2010 | Chih | ...................... G11C 16/10 |
| | | | 365/185.05 |
| 7,668,013 B2 * | 2/2010 | Chern | ..................... G11C 16/16 |
| | | | 365/185.05 |
| 7,868,375 B2 | 1/2011 | Liu et al. | |
| 9,286,982 B2 * | 3/2016 | Tran | ...................... G11C 16/16 |
| 9,430,735 B1 | 8/2016 | Vali | |
| 10,217,512 B1 | 2/2019 | Leobandung | |
| 10,269,440 B2 | 4/2019 | Guo | |
| 10,474,948 B2 | 11/2019 | Yakopcic | |
| 10,741,611 B1 | 8/2020 | Leobandung | |
| 2002/0089014 A1 | 7/2002 | Chern | |
| 2003/0034510 A1 | 2/2003 | Liu | |
| 2003/0052360 A1 | 3/2003 | Guterman | |
| 2003/0183871 A1 | 10/2003 | Dugger et al. | |
| 2004/0095809 A1 | 5/2004 | Sakamoto | |
| 2004/0125655 A1 | 7/2004 | Tsai | |
| 2004/0156241 A1 | 7/2004 | Tsai | |
| 2004/0150032 A1 | 8/2004 | Wu | |
| 2004/0155234 A1 | 8/2004 | Ishimaru | |
| 2004/0251949 A1 | 12/2004 | Shi | |
| 2005/0087892 A1 | 4/2005 | Hsu | |
| 2005/0122238 A1 | 6/2005 | Nomura | |
| 2006/0104120 A1 | 5/2006 | Hemink | |
| 2006/0170038 A1 | 8/2006 | Wong | |
| 2007/0171756 A1 | 7/2007 | Lambrache | |
| 2008/0304345 A1 | 12/2008 | Kwean | |
| 2009/0103361 A1 | 4/2009 | Wang | |
| 2009/0109760 A1 | 4/2009 | Nazarian | |
| 2009/0154246 A1 | 6/2009 | Liu | |
| 2009/0192958 A1 | 7/2009 | Todorokihara | |
| 2010/0046299 A1 | 2/2010 | Roohparvar | |
| 2010/0290292 A1 | 11/2010 | Tanizaki | |
| 2011/0161625 A1 | 6/2011 | Pechanek | |
| 2011/0235419 A1 | 9/2011 | Ishimaru | |
| 2012/0068872 A1 | 3/2012 | Baker | |
| 2012/0087188 A1 | 4/2012 | Hsieh et al. | |
| 2012/0136913 A1 | 5/2012 | Duong | |
| 2013/0044544 A1 | 2/2013 | Shiino | |
| 2013/0100756 A1 | 4/2013 | Liao et al. | |
| 2014/0054667 A1 | 2/2014 | Tkachev | |
| 2014/0140132 A1 | 5/2014 | Gu | |
| 2014/0269062 A1 | 9/2014 | Do | |
| 2014/0310220 A1 | 10/2014 | Chang | |
| 2015/0106315 A1 | 4/2015 | Birdwell | |
| 2015/0138183 A1 | 5/2015 | Kishi | |
| 2015/0178619 A1 | 6/2015 | Nishitani | |
| 2015/0199963 A1 | 7/2015 | Maaninen | |
| 2015/0213898 A1 | 7/2015 | Do | |
| 2015/0262055 A1 | 9/2015 | Akopyan | |
| 2015/0324691 A1 | 11/2015 | Dropps | |
| 2015/0371711 A1 | 12/2015 | Choy | |
| 2016/0042790 A1 | 2/2016 | Tran | |
| 2016/0048755 A1 | 2/2016 | Freyman | |
| 2016/0093382 A1 | 3/2016 | Sakamoto | |
| 2016/0133639 A1 | 5/2016 | Tran | |
| 2016/0180945 A1 | 6/2016 | Ng | |
| 2016/0254269 A1 | 9/2016 | Kim et al. | |
| 2017/0330070 A1 | 11/2017 | Sengupta | |
| 2017/0337466 A1 | 11/2017 | Bayat | |
| 2017/0337971 A1 | 11/2017 | Tran | |
| 2017/0337980 A1 | 11/2017 | Guo | |
| 2018/0004708 A1 | 1/2018 | Muralimanohar | |
| 2018/0095930 A1 | 4/2018 | Lu | |
| 2018/0165573 A1 | 6/2018 | Hsu | |
| 2018/0174034 A1 | 6/2018 | Obradovic | |
| 2018/0268912 A1 | 9/2018 | Guo et al. | |
| 2018/0293487 A1 | 10/2018 | Copel et al. | |
| 2019/0019538 A1 | 1/2019 | Li | |
| 2019/0019564 A1 | 1/2019 | Li | |
| 2019/0042199 A1 | 2/2019 | Sumbul | |
| 2019/0088325 A1 | 3/2019 | Tiwari et al. | |

(56) References Cited

U.S. PATENT DOCUMENTS

| | | | |
|---|---|---|---|
| 2019/0088329 | A1 | 3/2019 | Tiwari |
| 2019/0095779 | A1 | 3/2019 | Leobandung |
| 2019/0205729 | A1 | 7/2019 | Tran |
| 2019/0213234 | A1 | 7/2019 | Bayat |
| 2019/0237136 | A1 | 8/2019 | Tran et al. |
| 2019/0278675 | A1 | 9/2019 | Bolkhovitin |
| 2019/0294416 | A1 | 9/2019 | Hu |
| 2020/0020393 | A1 | 1/2020 | Al-Shamma |
| 2020/0201751 | A1 | 6/2020 | Wei |
| 2020/0233482 | A1 | 7/2020 | Tran |
| 2021/0232893 | A1 | 7/2021 | Bayat |

FOREIGN PATENT DOCUMENTS

| | | |
|---|---|---|
| CN | 104615909 | 5/2015 |
| EP | 0 566 739 A1 | 10/1993 |
| EP | 0 562 737 B1 | 6/1998 |
| JP | H03-018985 A | 1/1991 |
| JP | H 03-46195 | 2/1991 |
| JP | 63-261874 | 10/1998 |
| JP | 2003-151290 | 5/2003 |
| JP | 2009-080892 | 4/2009 |
| TW | 2004 14549 A | 8/2004 |
| TW | I 625843 | 6/2018 |
| TW | 2018 37759 | 10/2018 |
| TW | 2019 01285 | 1/2019 |
| WO | 2017 131653 | 8/2017 |

OTHER PUBLICATIONS

U.S. Appl. No. 16/382,045 entitled "Neural Network Classifier Using Array Of Three-Gate Non-volatile Memory Cells," Tran, et al, filed Apr. 11, 2019.
U.S. Appl. No. 16/382,051 entitled "Neural Network Classifier Using Array Of Stacked Gate Non-volatile Memory Cells," Tran, et al, filed Apr. 11, 2019.
U.S. Appl. No. 16/382,060 entitled "Memory Device And Method For Varying Program State Separation Based Upon Frequency Of Use," Tran, et al, filed Apr. 11, 2019.
U.S. Appl. No. 15/826,345 entitled "High Precision And Highly Tuning Mechanisms . . . Network," Tran, et al., filed Nov. 29, 2017.
U.S. Appl. No. 16/271,673 entitled "Flash Memory Array With Individual Memory Cell Read, Program And Erase," Guo et al., filed Feb. 8, 2019.
U.S. Appl. No. 15/991,890 entitled "Decoders For Analog Neural Memory In Deep Learning Artificial Neural Network," Tran, et al., filed May 29, 2018.
U.S. Appl. No. 16/353,830 entitled "System For Converting Neuron Current Into Neuron Current-Based Time Pulses . . . Network," Tran et al., filed Mar. 14, 2019.
U.S. Appl. No. 16/503,355, filed Jul. 3, 2019, Tran et al.
U.S. Appl. No. 16/354,040, filed Mar. 14, 2019, Tran et al.
U.S. Appl. No. 16/353,409, titled "Apparatus and Method for Combining Analog Neural Net With FPGA Routing in a Monolithic Integrated Circuit," filed Mar. 14, 2019.
U.S. Appl. No. 62/797,158, titled "Apparatus and Method for Combining Analog Neural Net With FPGA Routing in a Monolithic Integrated Circuit," filed Jan. 25, 2019.
U.S. Appl. No. 16/382,013 entitled "Neural Network Classifier Using Array Of Two-Gate Non-volatile Memory Cells," Tran, et al, filed Apr. 11, 2019.
Jenn-Chyou Bor, et al., "Realization of the CMOS Pulsewidth-Modulation (PWM) Neural Network with On-Chip Learning," IEEE Transactions on Circuits and Systems, Jan. 1998.
Alister Hamilton, et al., "Integrated Pulse Stream Neural Networks: Results, Issues, and Pointers," IEEE Transactions on Neural Networks, May 1992.
Shafiee et al,"Isaac: A Convolutional Neural Network Accelerator With In-Situ Analog Arithmetic in Crossbars;" 2016 ACM/IEEE 43rd Annual International Symposium on Computer Architecture, Seoul, Oct. 2016. [URL:https://www.cs.utah.edu/-rajeev/pubs/isca16.pdf; pp. 1-4.].
Guo, et al., "Temperature-insensitive Analog Vector-by-Matrix Multiplier Based on 55 nm NOR Flash Memory Cells," IEEE Custom Integrated Circuits Conference, Apr. 30, 2017, pp. 1-4.
Lin, et al., "A Novel Voltage-Accumulation Vector-Matrix Multiplication Architecture Using Resistor-shunted Floating Gate Flash Memory Device for Low-power and High-density Neural Network Applications," IEEE International Electron Devices Meeting, Dec. 1, 2018, pp. 2.4.1-2.4.4.
Bavandpour, et al., "Energy-Efficient Time-Domain Vector-by-Matrix Multiplier for Neurocomputing and Beyond," retrieved from the Internet: url:https://arxiv.org/pdf/1711.10673.pdf, pp. 1-6.
Mehrotra, et al., "Elements of Artificial Neural Networks," 1997 Massachusetts Institute of Technology, pp. 1-351, a Bradford Book, The MIT Press, Cambridge, Mass, London, England.
Bayat, "Memory Technologies for Neural Networks," IEEE, 2015.
European Examiner's Report dated Nov. 25, 2021 for the related European Patent Application No. 17 799 921.6.
Chinese Office Action dated Oct. 9, 2021 corresponding to Chinese Patent Application No. 201780030390.9.

* cited by examiner

MEMORY DEVICE OF NON-VOLATILE MEMORY CELLS

RELATED APPLICATIONS

This application is a continuation application of U.S. patent application Ser. No. 17/580,862, filed on Jan. 21, 2022, which is a continuation application of Ser. No. 15/594,439, filed on May 12, 2017, which claims the benefit of U.S. Provisional Application No. 62/337,760 filed on May 17, 2016, and which are incorporated herein by reference.

FIELD OF THE INVENTION

The present invention relates to neural networks.

BACKGROUND OF THE INVENTION

Artificial neural networks mimic biological neural networks (the central nervous systems of animals, in particular the brain) which are used to estimate or approximate functions that can depend on a large number of inputs and are generally unknown. Artificial neural networks generally include layers of interconnected "neurons" which exchange messages between each other. FIG. 1 illustrates an artificial neural network, where the circles represent the inputs or layers of neurons. The connections (called synapses) are represented by arrows, and have numeric weights that can be tuned based on experience. This makes neural nets adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

BRIEF SUMMARY OF THE INVENTION

The aforementioned problems and needs are addressed by a memory device that includes a plurality of non-volatile memory cells arranged in rows and columns, having source regions arranged in rows and columns, and drain regions arranged in rows and columns, wherein respective ones of the columns of drain regions include first drain regions and second drain regions that alternate with each other. A plurality of first lines wherein respective ones of the plurality of first lines electrically connect together the source regions in one of the rows of the source regions and are electrically isolated from the source regions in other rows of the source regions. A plurality of second lines wherein respective ones of the plurality of second lines electrically connect together the first drain regions of one of the columns of drain regions and are electrically isolated from the second drain regions of the one column of drain regions. A plurality of third lines wherein respective ones of the plurality of third lines electrically connect together the second drain regions of one of the columns of drain regions and are electrically isolated from the first drain regions of the one column of drain regions.

A memory device includes a plurality of memory cells arranged in rows and columns. each column of the memory cells includes a plurality of alternating source and drain regions formed in a semiconductor substrate, with two channel regions of the semiconductor substrate extending from each of the source regions to an adjacent two of the drain regions respectively, wherein the drain regions include first drain regions and second drain regions that alternate with each other, a plurality of floating gates each disposed over and insulated from a first portion of one of the channel regions, and a plurality of first non-floating gates each disposed over and insulated from a second portion of one of the channel regions. The source regions are arranged in rows and columns. A plurality of first lines each electrically connecting together the source regions in one of the rows of the source regions and electrically isolated from the source regions in other rows of the source regions. For each one of the columns of memory cells, the memory device further includes a second line electrically connecting together the first drain regions of the one column and electrically isolated from the second drain regions of the one column, and a third line electrically connecting together the second drain regions of the one column and electrically isolated from the first drain regions of the one column.

Other objects and features of the present invention will become apparent by a review of the specification, claims and appended figures.

DETAILED DESCRIPTION OF THE INVENTION

Figure 2:
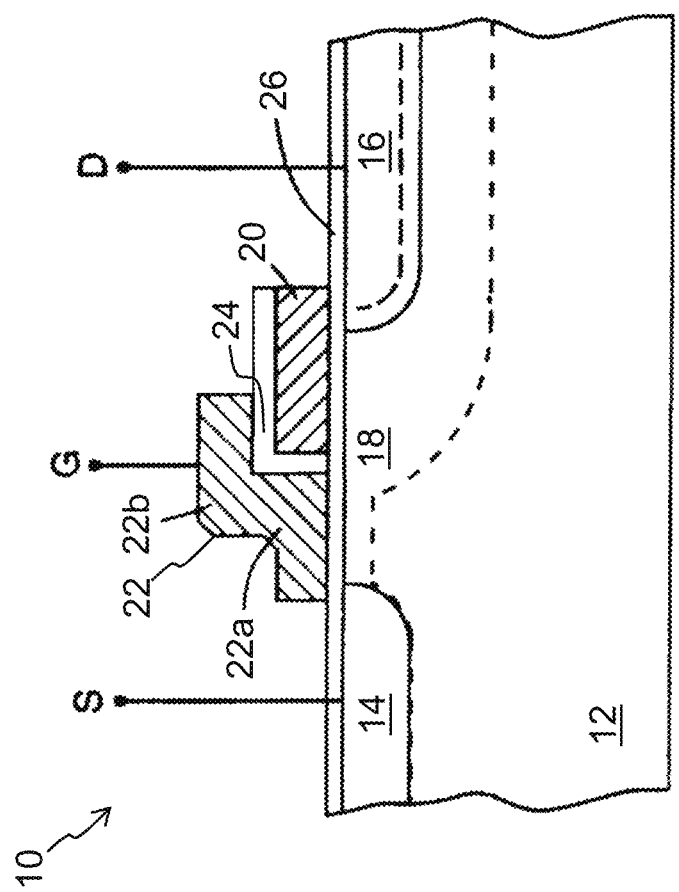
FIG. 2 is a side cross sectional view of conventional 2-gate non-volatile memory cell.

The artificial neural networks of the present invention utilize a combination of CMOS technology and non-volatile memory arrays. Digital non-volatile memories are well known. For example, U.S. Pat. No. 5,029,130 ("the '130 patent") discloses an array of split gate non-volatile memory cells, and is incorporated herein by reference for all purposes. The memory cell is shown in FIG. 2. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 has a first portion 22a that is disposed over and insulated from (and controls the conductivity of) a second portion of the channel region 18, and a second portion 22b that extends up and over the floating gate 20. The floating gate 20 and control gate 22 are insulated from the substrate 12 by a gate oxide 26.

The memory cell is erased (where electrons are removed from the floating gate) by placing a high positive voltage on the control gate 22, which causes electrons on the floating gate 20 to tunnel through the intermediate insulation 24 from the floating gate 20 to the control gate 22 via Fowler-Nordheim tunneling.

The memory cell is programmed (where electrons are placed on the floating gate) by placing a positive voltage on the control gate 22, and a positive voltage on the drain 16. Electron current will flow from the source 14 towards the drain 16. The electrons will accelerate and become heated when they reach the gap between the control gate 22 and the floating gate 20. Some of the heated electrons will be injected through the gate oxide 26 onto the floating gate 20 due to the attractive electrostatic force from the floating gate 20.

The memory cell is read by placing positive read voltages on the drain 16 and control gate 22 (which turns on the channel region under the control gate). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Figure 3:
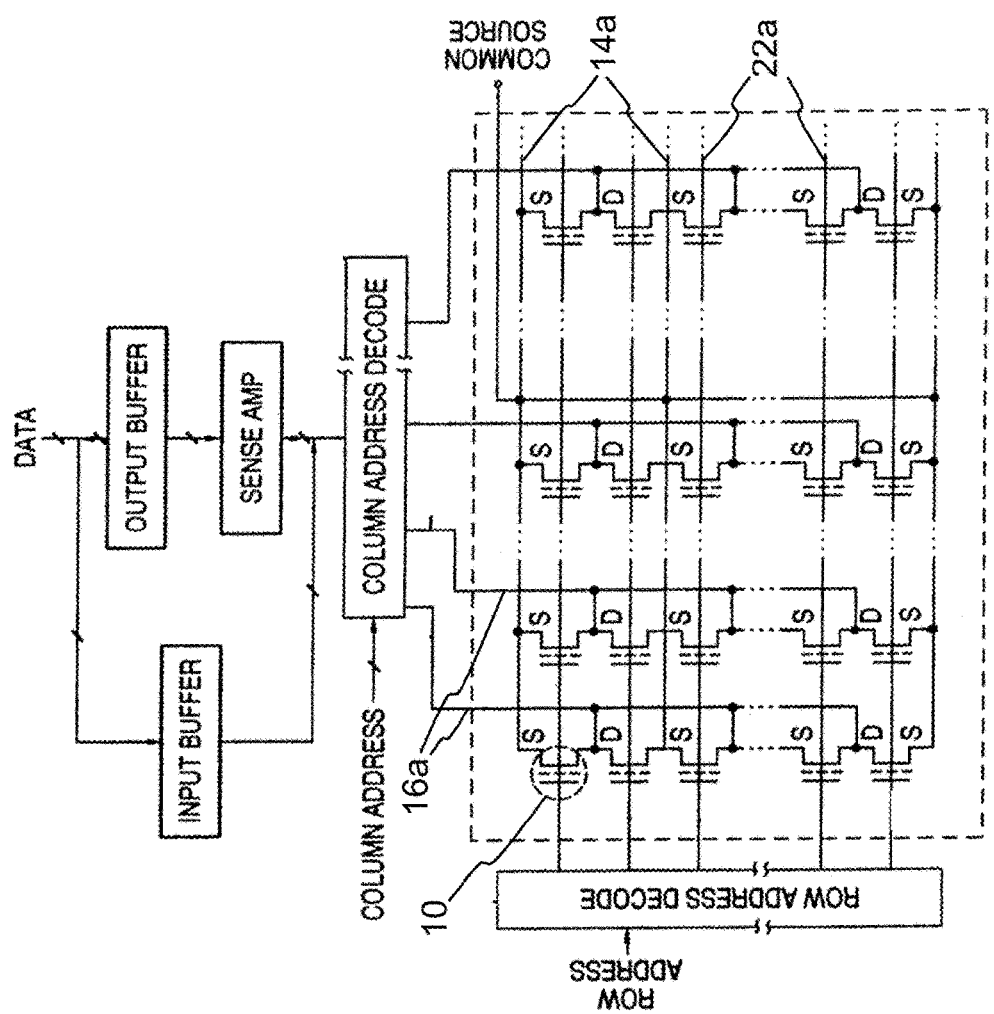
FIG. 3 is a diagram illustrating a conventional array architecture for the memory cell of FIG. 2.

The architecture of the memory array is shown in FIG. 3. The memory cells 10 are arranged in rows and columns. In each column, the memory cells are arranged end to end in mirror fashion, so that they are formed as pairs of memory cells each sharing a common source region 14 (S), and each adjacent set of memory cell pairs sharing a common drain region 16 (D). All the source regions 14 for any given row of memory cells are electrically connected together by a source line 14a. All the drain regions 16 for any given column of memory cells are electrically connected together by a bit line 16a. All the control gates 22 for any given row of memory cells are electrically connected together by a control gate line 22a. Therefore, while the memory cells can be individually programmed and read, memory cell erasure is performed row by row (each row of memory cells is erased together, by the application of a high voltage on the control gate line 22a). If a particular memory cell is to be erased, all the memory cells in the same row are also erased.

Figure 5:
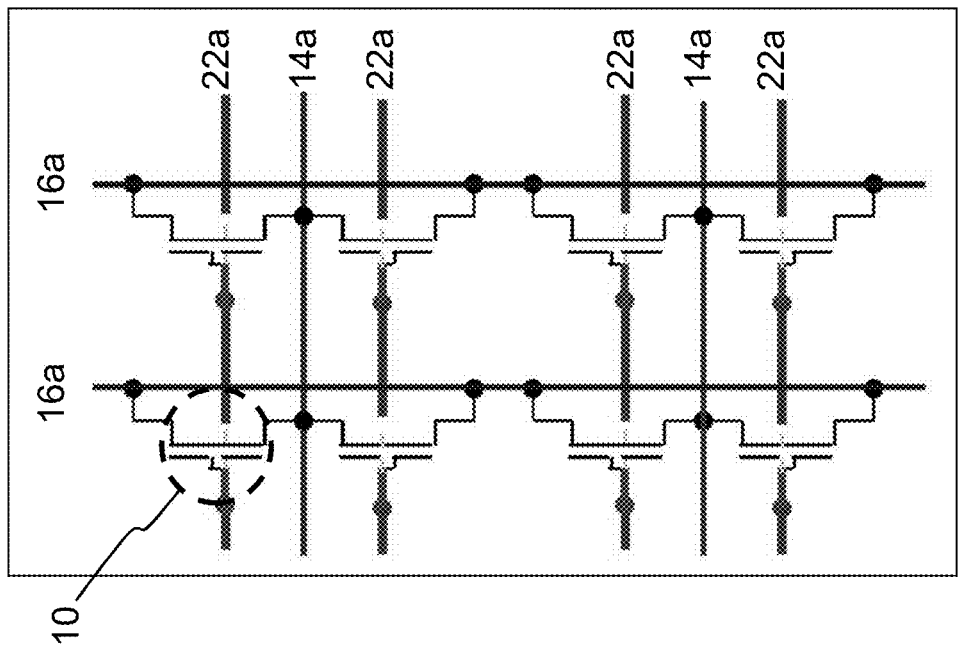
FIG. 5 is a diagram illustrating a conventional array architecture for the memory cell of FIG. 4.
Figure 4:
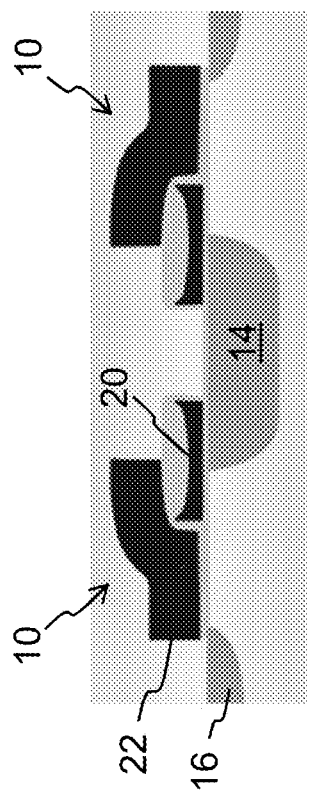
FIG. 4 is a side cross sectional view of conventional 2-gate non-volatile memory cell.

Those skilled in the art understand that the source and drain can be interchangeable, where the floating gate can extend partially over the source instead of the drain, as shown in FIG. 4. FIG. 5 best illustrates the corresponding memory cell architecture, including the memory cells 10, the source lines 14a, the bit lines 16a, and the control gate lines 22a. As is evident from the figures, memory cells 10 of the same row share the same source line 14a and the same control gate line 22a, while the drain regions of all cells of the same column are electrically connected to the same bit line 16a. The array design is optimized for digital applications, and permits individual programming of the selected cells, e.g., by applying 1.6 V and 7.6 V to the selected control gate line 22a and source line 14a, respectively, and grounding the selected bit line 16a. Disturbing the non-selected memory cell in the same pair is avoided by applying a voltage greater than 2 volts on the unselected bit lines 16a and grounding the remaining lines. The memory cells 10 cannot be erased individually because the process responsible for erasure (the Fowler-Nordheim tunneling of electrons from the floating gate 20 to the control gate 22) is only weakly affected by the drain voltage (i.e., the only voltage which may be different for two adjacent cells in the row direction sharing the same source line 14a).

Figure 6:
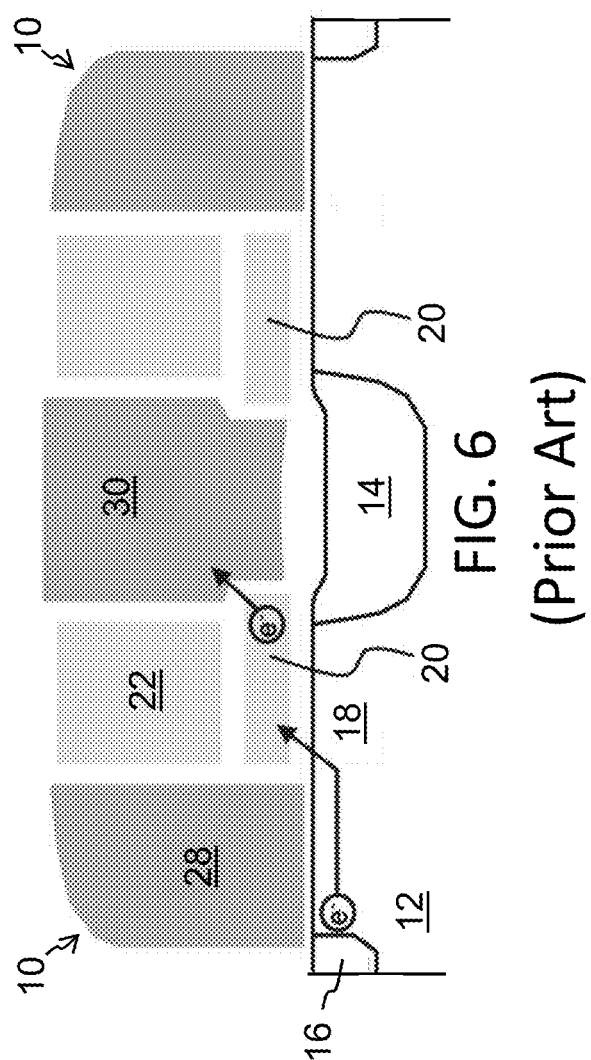
FIG. 6 is a side cross sectional view of conventional 4-gate non-volatile memory cell.

Split gate memory cells having more than two gates are also known. For example, memory cells have source region 14, drain region 16, floating gate 20 over a first portion of channel region 18, a select gate 28 over a second portion of the channel region 18, a control gate 22 over the floating gate 20, and an erase gate 30 over the source region 14 are known, as shown in FIG. 6 (see for example U.S. Pat. No. 6,747,310, which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Figure 7:
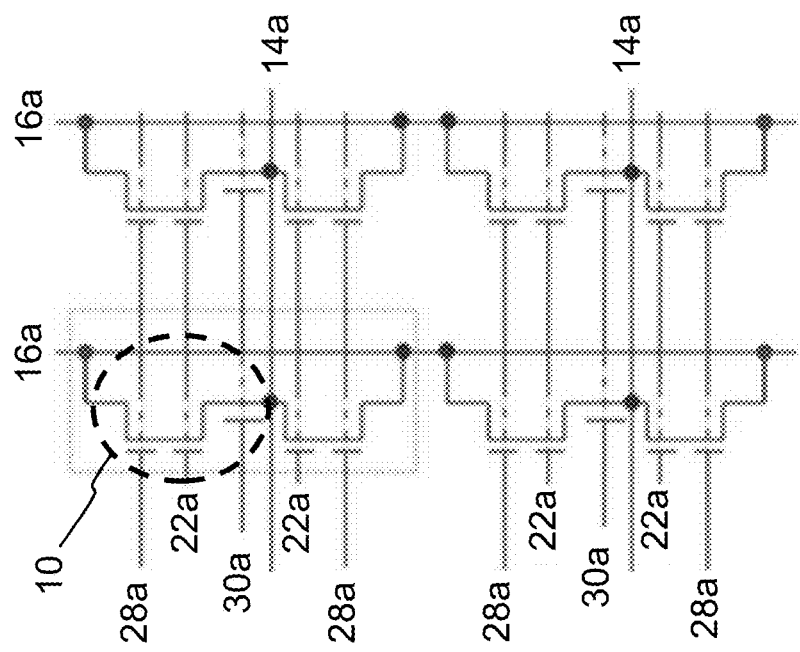
FIG. 7 is a diagram illustrating a conventional array architecture for the memory cell of FIG. 6.
Figure 8:
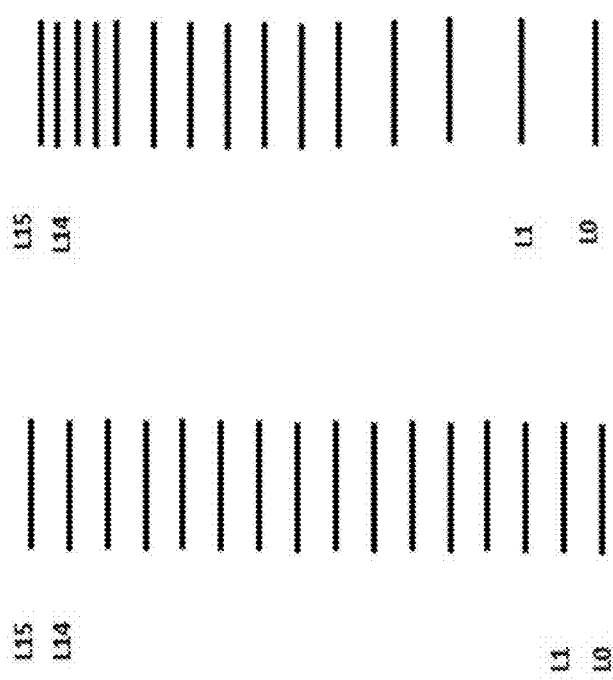
FIG. 8A is a diagram illustrating neural network weight level assignments that are evenly spaced.
FIG. 8B is a diagram illustrating neural network weight level assignments that are unevenly spaced.

The architecture for a four-gate memory cell array can be configured as shown in FIG. 7. In this embodiment, each horizontal select gate line 28a electrically connects together all the select gates 28 for that row of memory cells. Each horizontal control gate line 22a electrically connects together all the control gates 22 for that row of memory cells. Each horizontal source line 14a electrically connects together all the source regions 14 for two rows of memory cells that share the source regions 14. Each bit line 16a electrically connects together all the drain regions 16 for that column of memory cells. Each erase gate line 30a electrically connects together all the erase gates 30 for two rows of memory cells that share the erase gate 30. As with the previous architecture, individual memory cells can be independently programmed and read. However, there is no way to erase cells individually. Erasing is performed by placing a high positive voltage on the erase gate line 30a, which results in the simultaneous erasing of both rows of the memory cells that share the same erase gate line 30a. Exemplary operating voltages can include those in Table 1 below (in this embodiment, select gate lines 28a can be referred to as word lines WL):

or unevenly spaced as shown in FIG. 8B. Programming of the non-volatile memory cells can be implemented using a bidirectional tuning algorithm such as that shown in FIG. 9. Icell is the read current of the target cell being programmed, and Itarget is the desired read current when the cell is ideally programmed. The target cell read current Icell is read (step 1) and compared to the target read current Itarget (step 2). If the target cell read current Icell is greater than the target read current Itarget, a programming tuning process is performed (step 3) to increase the number of electrons on the floating gate (in which a look up table is used to determine the desired programming voltage VCG on the control gate) (steps 3a-3b), which can be repeated as necessary (step 3c). If the target cell read current Icell is less than the target read current Itarget, an erase tuning process is performed (step 4) to decrease the number of electrons on the floating gate (in which a look up table is used to determine the desired erase voltage VEG on the erase gate) (steps 4a-4b), which can be repeated as necessary (step 4c). If a programming tuning process overshoots the target read current, then an erase tuning process is performed (step 3d and starting with step 4a), and vice versa (step 4d and starting with step 3a), until the target read current is achieved (within an acceptable delta value).

Figure 9:
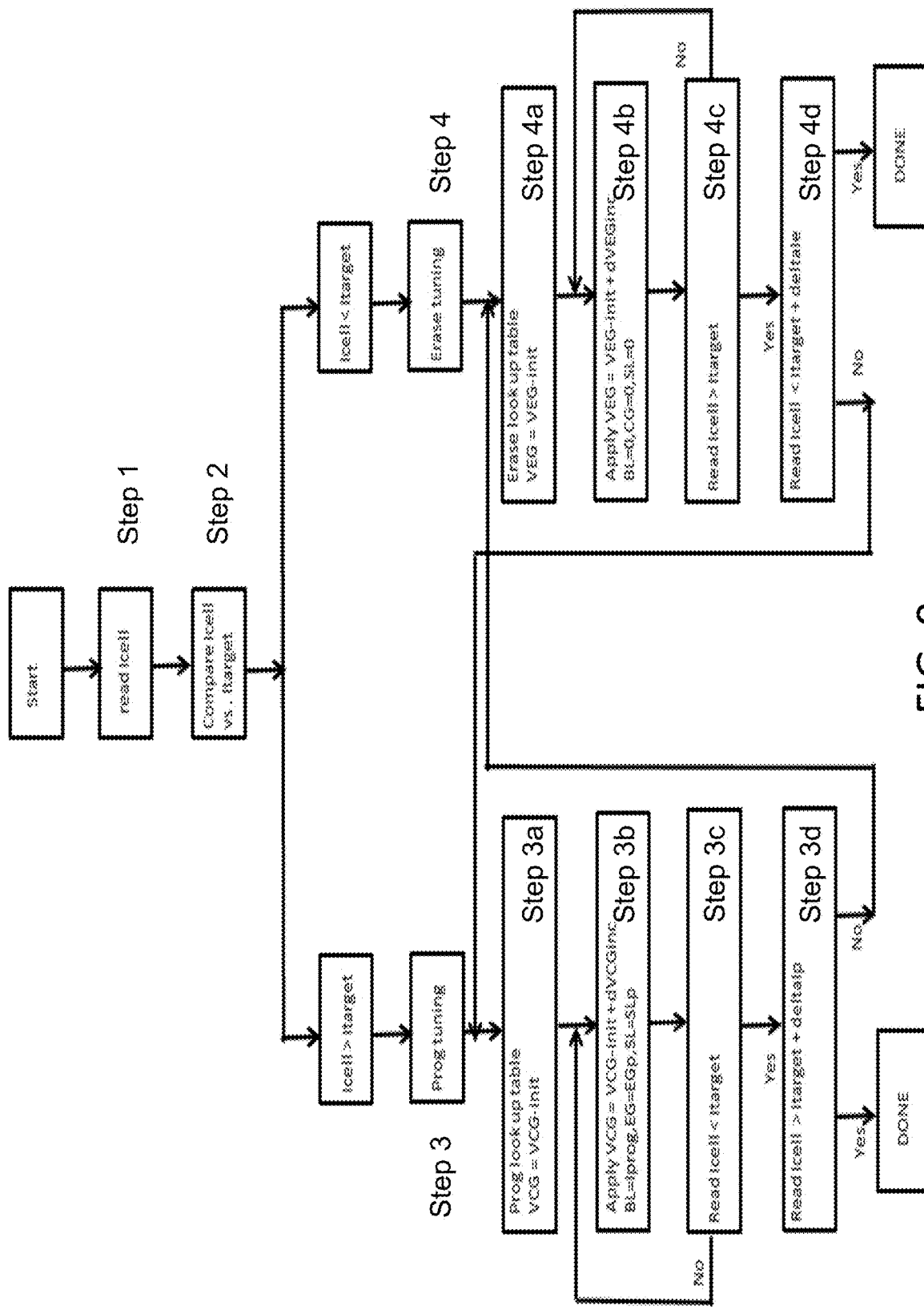
FIG. 9 is a flow diagram illustrating a bidirectional tuning algorithm.

Programming of the non-volatile memory cells can instead be implemented using a unidirectional tuning algorithm using programming tuning. With this algorithm, the memory cell is initially fully erased, and then the programming tuning steps 3a-3c in FIG. 9 are performed until the read current of the target cell reaches the target threshold value. Alternately, the tuning of the non-volatile memory cells can be implemented using the unidirectional tuning algorithm using erasing tuning. In this approach, the memory cell is initially fully programmed, and then the

TABLE 1

|  | WL | | BL | | SL | | CG | | EG | |
| --- | --- | --- | --- | --- | --- | --- | --- | --- | --- | --- |
|  | Sel. | Unsel. | Sel. | Unsel | Sel. | Unsel. | Sel. | Unsel. | Sel. | Unsel. |
| Erase | 0 V | 0 V | 0 V | 0 V | 0 V | 0 V | 0 V | 0 V | 11.5 V | 0 V |
| Read | 2.5 V | 0 V | 0.8 V | 0 V | 0 V | 0 V | 2.5 V | 2.5 V | 0 V | 0 V |
| Program | 1 V | 0 V | 1 μA | 2.5 V | 4.5 V | 0.5 V | 10.5 V | 0/2.5 V | 4.5 V | 0.5 V |

In order to utilize the above described non-volatile memory arrays in neural networks, two modifications are made. First, the lines are reconfigured so that each memory cell can be individually programmed, erased and read without adversely affecting the memory state of other memory cells in the array, as further explained below. Second, continuous (analog) programming of the memory cells is provided. Specifically, the memory state (i.e. charge on the floating gate) of each memory cells in the array can be continuously changed from a fully erased state to a fully programmed state, and vice versa, independently and with minimal disturbance of other memory cells. This means the cell storage is analog or at the very least can store one of many discrete values, which allows for very precise and individual tuning of all the cells in the memory array, and which makes the memory array ideal for storing and making fine tuning adjustments to the synapsis weights of the neural network.

Memory Cell Programming and Storage

The neural network weight level assignments as stored in the memory cells can be evenly spaced as shown in FIG. 8A, erasing tuning steps 4a-4c in FIG. 9 are performed until the read current of the target cell reaches the target threshold value.

Figure 10:
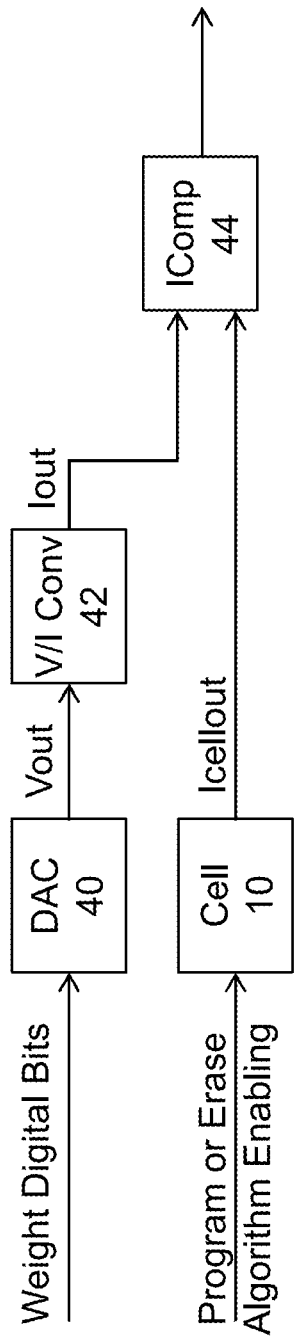
FIG. 10 is a block diagram illustrating weight mapping using current comparison.

FIG. 10 is a diagram illustrating weight mapping using current comparison. The weight digital bits (e.g., 5-bit weight for each synapsis, representing the target digital weight for the memory cell) are input to a digital-to-analog converter (DAC) 40, which converts the bits to voltage Vout (e.g., 64 voltage levels—5 bits). Vout is converted to a current Iout (e.g. 64 current levels—5 bits) by voltage-to-current converter V/I Conv 42. The current is supplied to a current comparator IComp 44. Program or erase algorithm enabling are input to the memory cell 10 (for example, erase: incrementing EG voltage; or program: increment CG voltage). The memory cell current out Icellout (i.e. from a read operation) is supplied to the current comparator IComp 44. The current comparator IComp 44 compares the memory cell current Icellout with the current Iout derived from the weight digital bits to produce a signal indicative of the weight stored in the memory cell 10.

Figure 11:
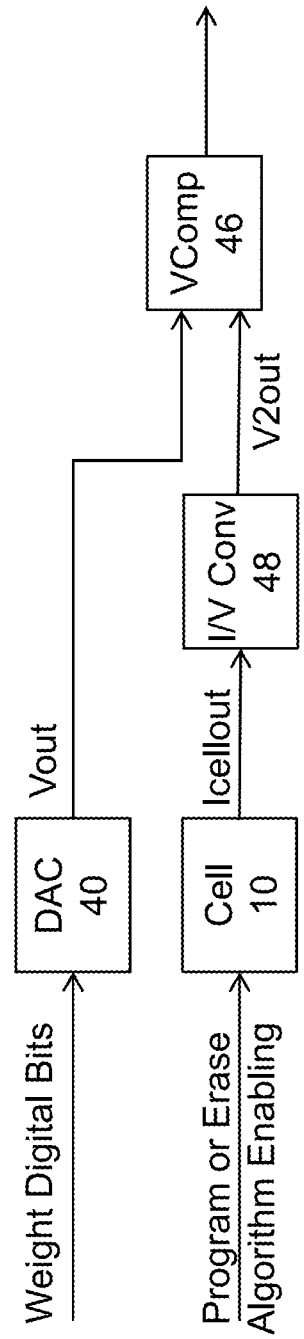
FIG. 11 is a block diagram illustrating weight mapping using voltage comparison.

FIG. 11 is a diagram illustrating weight mapping using voltage comparison. The weight digital bits (e.g., 5-bit weight for each synapsis) are input to a digital-to-analog converter (DAC) 40, which converts the bits to voltage Vout (e.g., 64 voltage levels—5 bits). Vout is supplied to a voltage comparator VComp 46. Program or erase algorithm enabling are input to the memory cell 10 (for example, erase: incrementing EG voltage; or program: increment CG voltage). The memory cell current out Icellout is supplied to current-to-voltage converter I/V Conv 48 for conversion to a voltage V2out (e.g. 64 voltage levels—5 bits). Voltage V2out is supplied to voltage comparator VComp 46. The voltage comparator VComp 46 compares the voltages Vout and V2 out to produce a signal indicative of the weight stored in the memory cell 10.

Neural Networks Employing Non-Volatile Memory Cell Array

Figure 12:
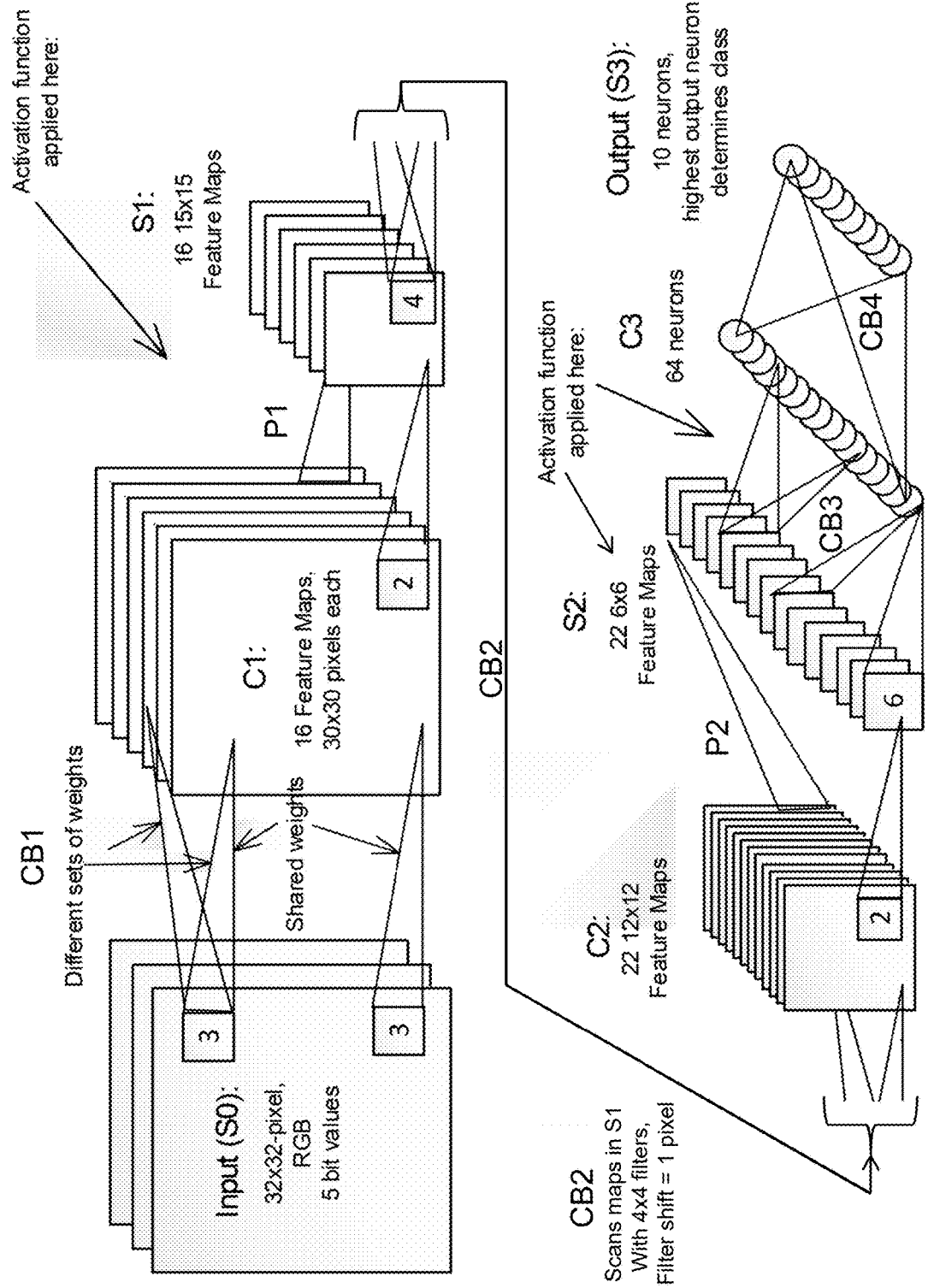
FIG. 12 is a diagram illustrating the different levels of an exemplary neural network utilizing a non-volatile memory array.

FIG. 12 conceptually illustrates a non-limiting example of a neural network utilizing a non-volatile memory array. This example uses the non-volatile memory array neural net for a facial recognition application, but any other appropriate application could be implemented using a non-volatile memory array based neural network. S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 13:
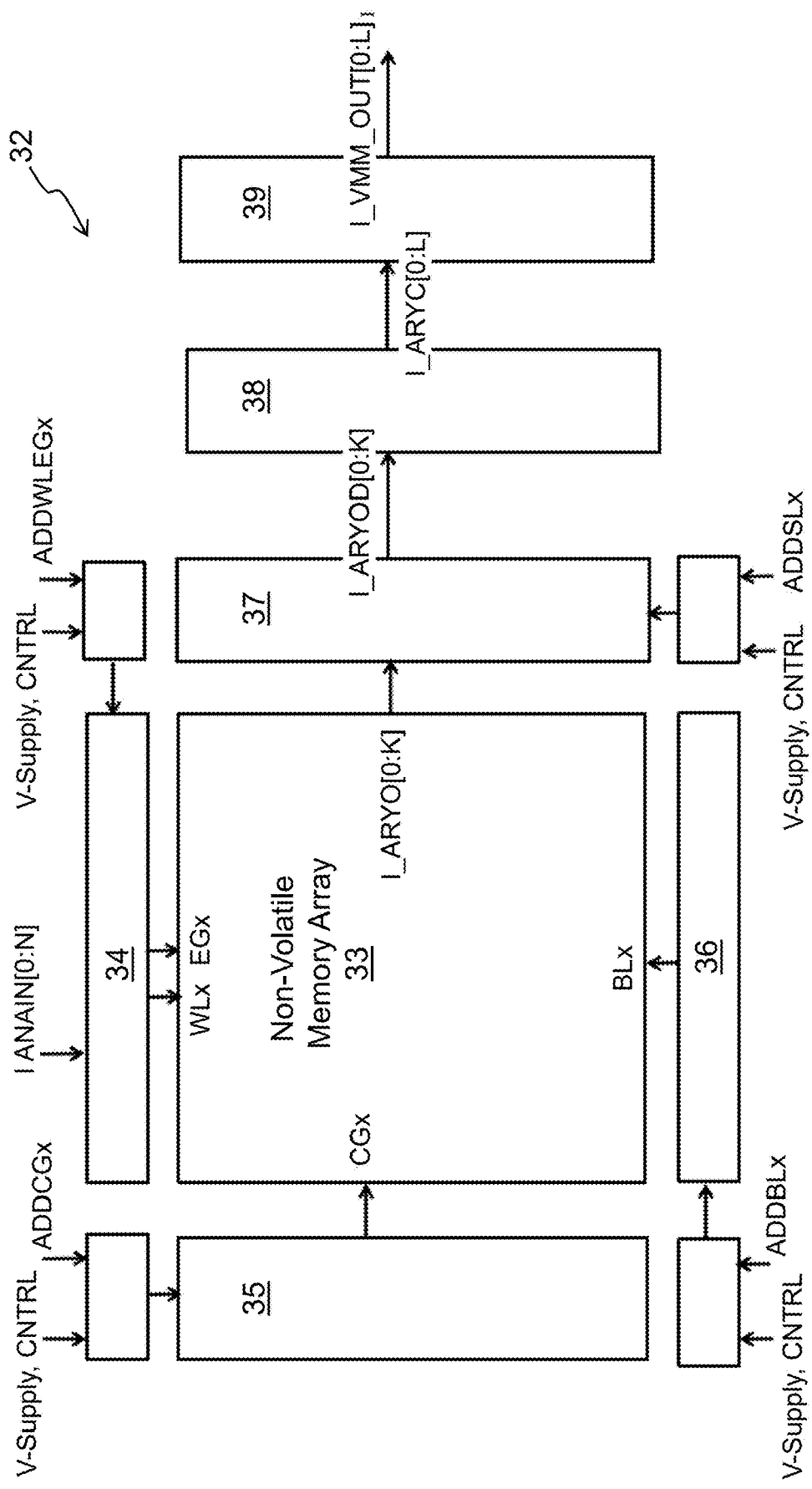
FIG. 13 is a block diagram illustrating a vector multiplier matrix.

Each level of synapses is implemented using an array, or a portion of an array, of non-volatile memory cells. FIG. 13 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. The memory array serves two purposes. First, it stores the weights that will be used by the VMM. Second, the memory array effectively multiplies the inputs by the weights stored in the memory array to produce the output, which will be the input to the next layer or input to the final layer. By performing the multiplication function, the memory array negates the need for separate multiplication logic circuits and is also power efficient.

The output of the memory array is supplied to a differential summing op-amp 38, which sums up the outputs of the memory cell array to create a single value for that convolution. The summed up output values are then supplied to the activation function circuit 39, which rectifies the output. The rectified output values become an element of a feature map as the next layer (C1 in the description above for example), and are then applied to the next synapse to produce next feature map layer or final layer. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 14:
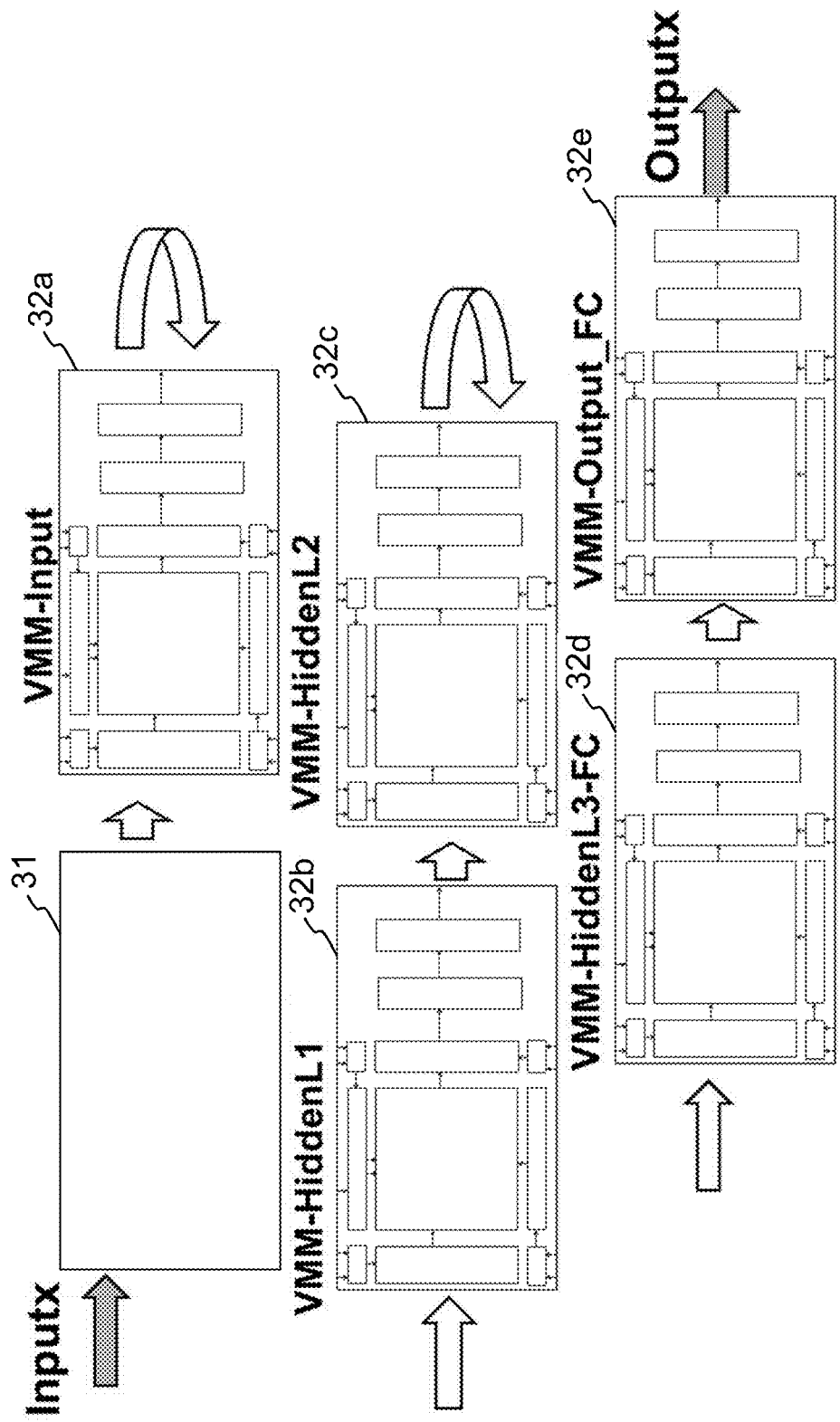
FIG. 14 is a block diagram illustrating various levels of a vector multiplier matrix.

FIG. 14 is a block diagram of the various levels of VMM. As shown in FIG. 14, the input is converted from digital to analog by digital-to-analog converter 31, and provided to input VMM 32a. The output generated by the input VMM 32a is provided as an input to the next VMM (hidden level 1) 32b, which in turn generates an output that is provided as an input to the next VMM (hidden level 2) 32c, and so on. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array.

Figure 15:
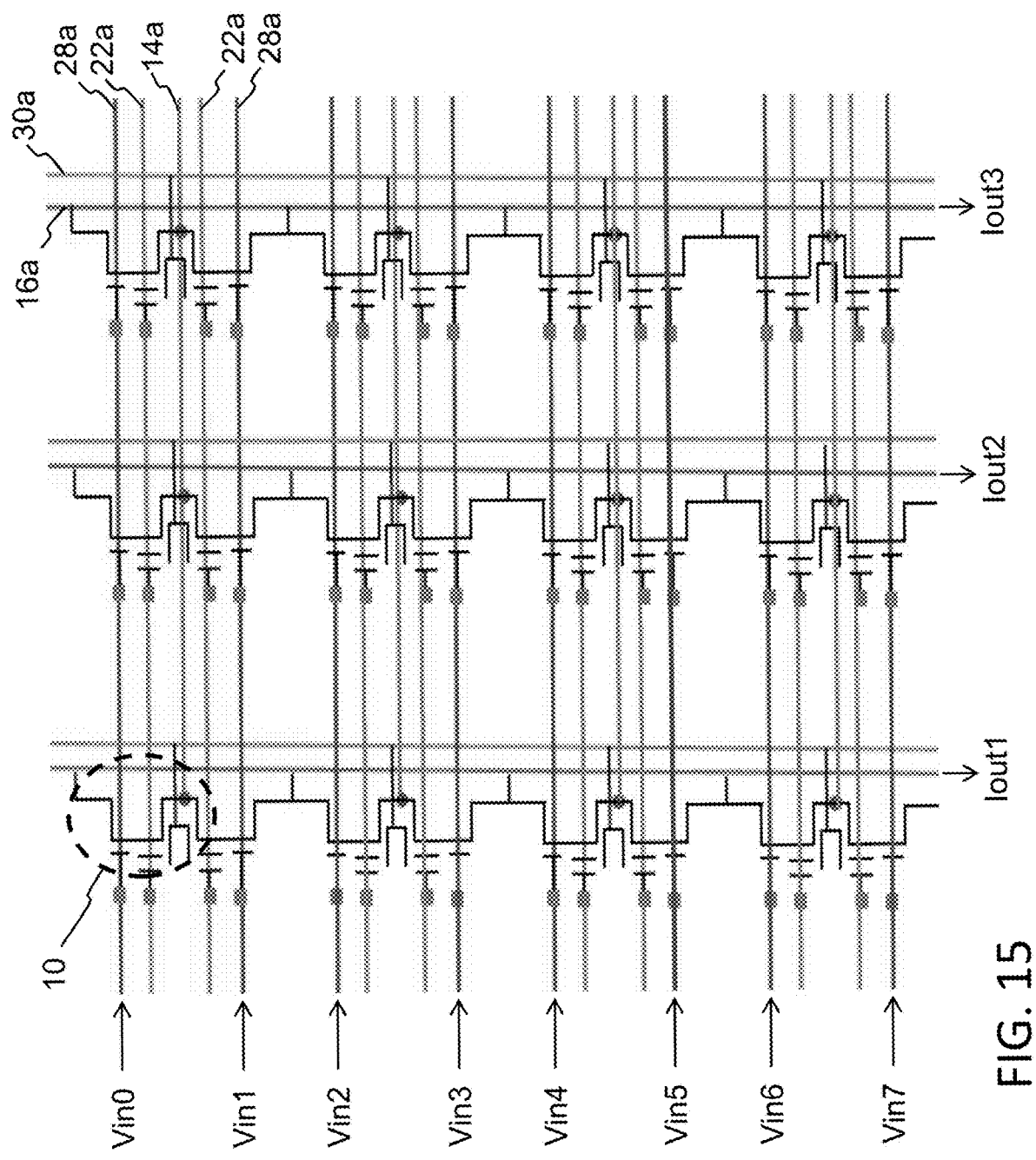
FIGS. 15-16 are schematic diagrams illustrating a first architecture of an array of four-gate memory cells.

FIG. 15 illustrates an array of four-gate memory cells (i.e., such as that shown in FIG. 6) arranged as a drain summing matrix multiplier. The various gate and region lines for the array of FIG. 15 are the same as that in FIG. 7 (with the same element numbers for corresponding structure), except that the erase gate lines 30a run vertically instead of horizontally (i.e., each erase gate line 30a connects together all the erase gates 30 for that column of memory cells) so that each memory cell 10 can be independently programmed, erased and read. After each of the memory cells is programmed with the appropriate weight value for that cell, the array acts as a drain summing matrix multiplier. The matrix inputs are Vin0 . . . Vin7 and are placed on select gate lines 28a. The matrix of outputs Iout0 . . . IoutN for the array of FIG. 15 are produced on the bit lines 16a. Each output Iout is a sum of the cell current I times the weight W stored in the cell, for all the cells in the column:

$$Iout=\Sigma(Iij*Wij)$$

Figure 16:
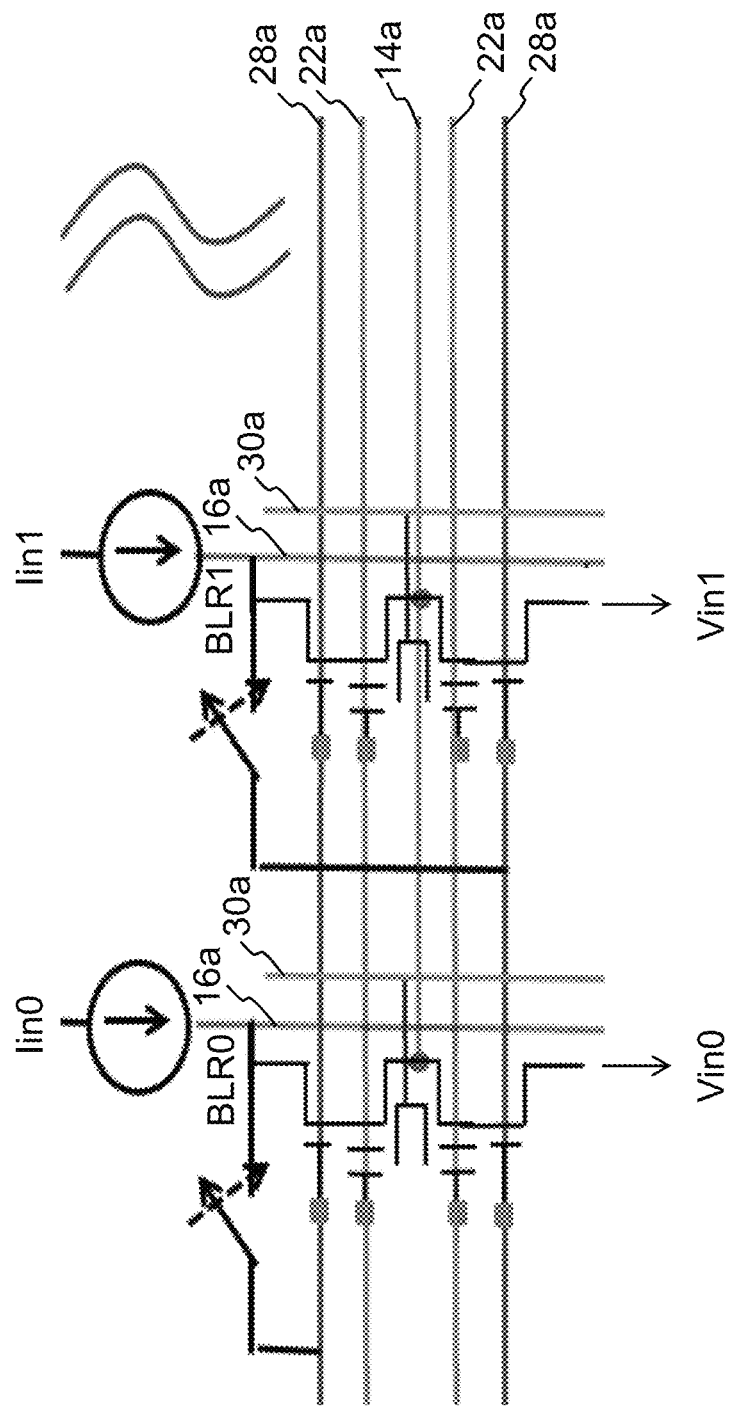

Each memory cell (or pair of memory cells) acts as a single synapse having a weight value expressed as output current Iout dictated by the sum of the weight values stored in the memory cell (or pair of memory cells) in that column. The output of any given synapse is in the form of current. Therefore, each subsequent VMM stage after the first stage preferably includes circuitry for converting incoming currents from the previous VMM stage into voltages to be used as the input voltages Vin. FIG. 16 illustrates an example of such current-to-voltage conversion circuitry, which is a modified row of memory cells that log converts the incoming currents Iin0 . . . IinN into the input voltages Vin0 . . . VinN. The memory cells described herein are biased in weak inversion, $$Ids=Io*e^{(Vg-Vth)/kVt}=w*Io*e^{(Vg)/kVt}$$

For the I-to-V log converter using a memory cell to convert input current into an input voltage:

$$Vg=k*Vt*\log[Ids/wp*Io]$$

For a memory array used as a vector matrix multiplier VMM, the output current is:

$$Iout=wa*Io*e^{(Vg)/kVt}, \text{ namely}$$

$$Iout=(wa/wp)*Iin=W*Iin$$

Figure 17:
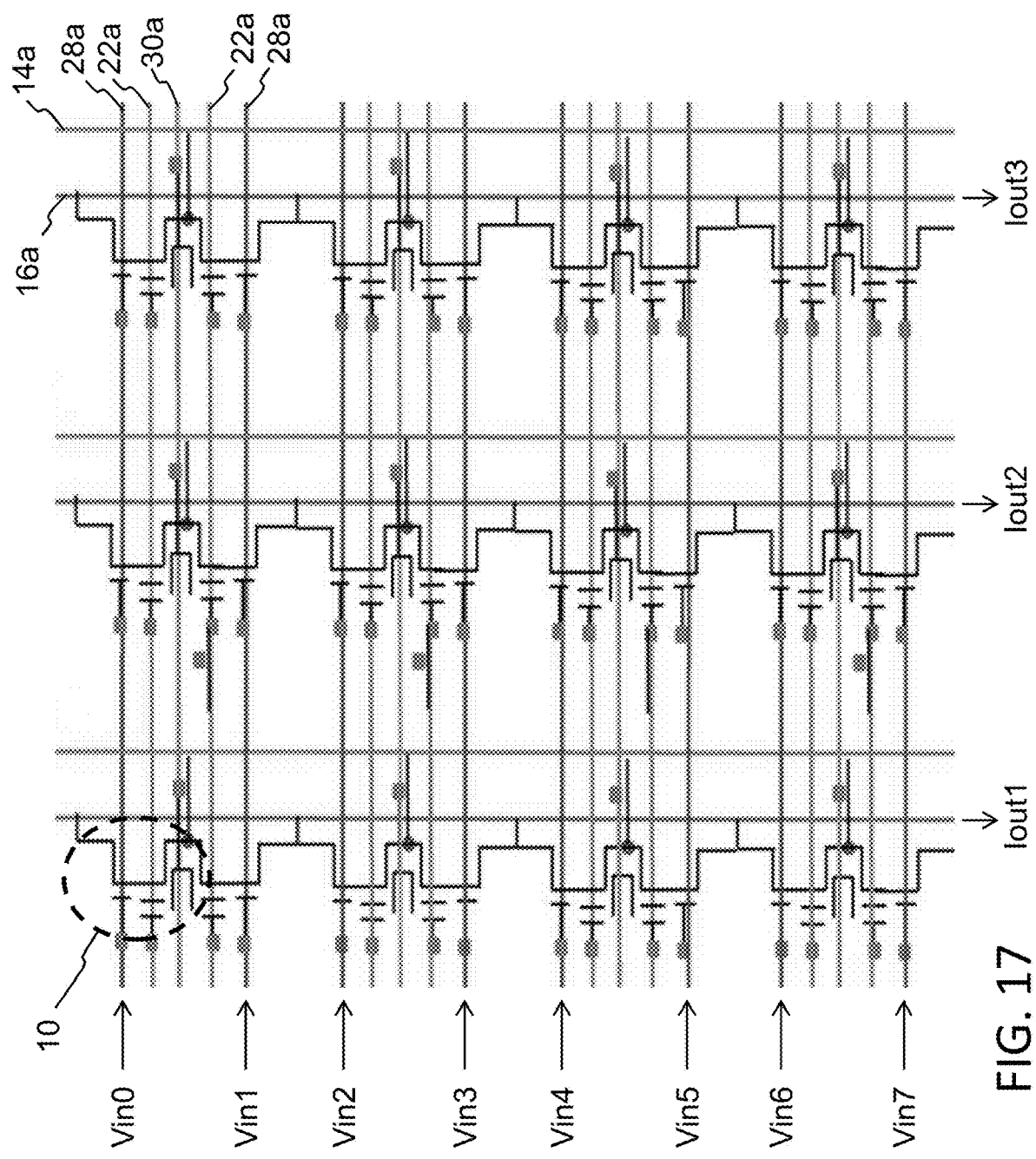
FIGS. 17-18 are schematic diagrams illustrating a second architecture of an array of four-gate memory cells.
Figure 18:
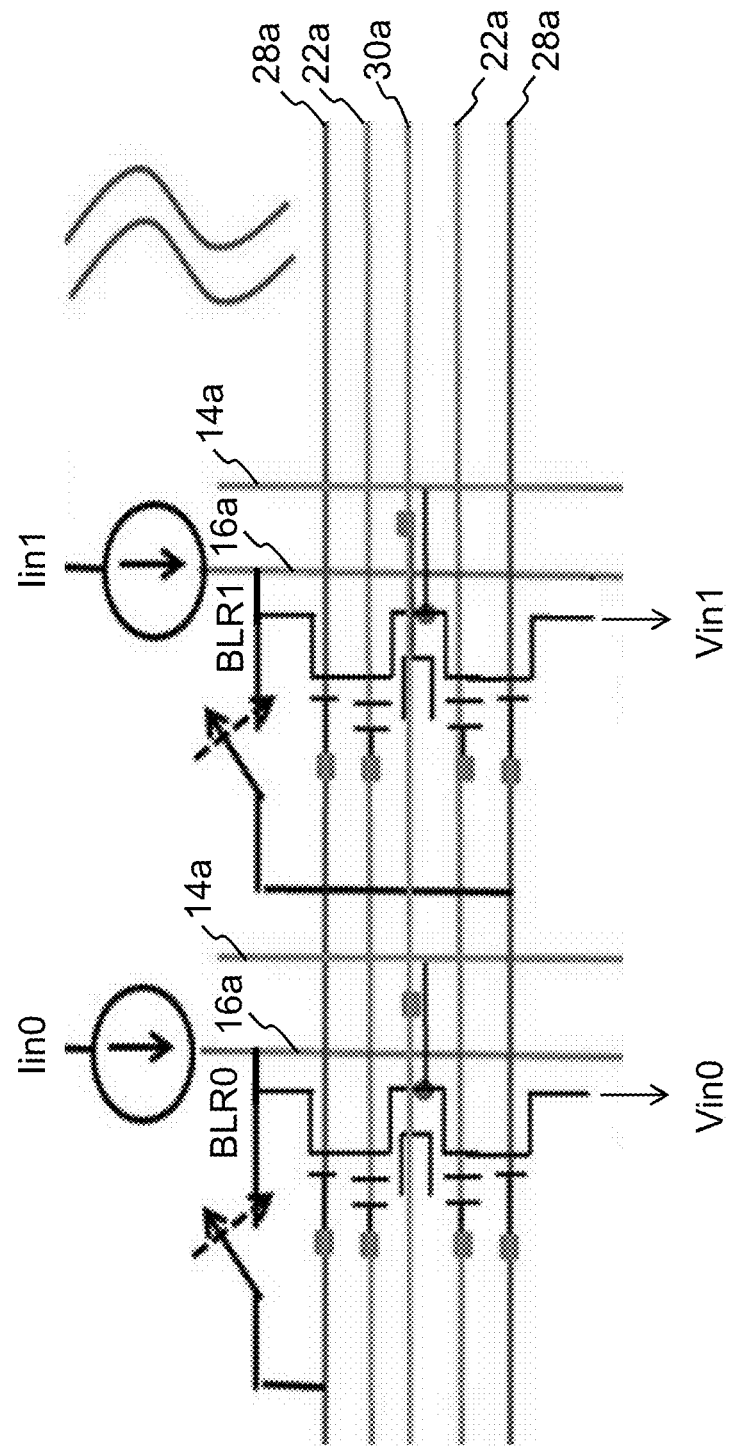

FIGS. 17 and 18 illustrate another configuration of an array of four-gate memory cells (i.e., such as that shown in FIG. 6) arranged as a drain summing matrix multiplier. The lines for the array of FIGS. 17 and 18 are the same as that in the array of FIGS. 15 and 16, except that the source lines 14a run vertically instead of horizontally (i.e., each source line 14a connects together all the source regions 14 for that column of memory cells) and erase gate lines 30a run horizontally instead of vertically (i.e., each erase gate line 30a connects together all the erase gates 30 for that row of memory cell pairs), so that each memory cell can be independently programmed, erased and read. The matrix inputs Vin0 . . . VinN remain on select gate lines 28a, and the matrix outputs Iout0 . . . IoutN remain on the bit lines 16a.

Figure 19:
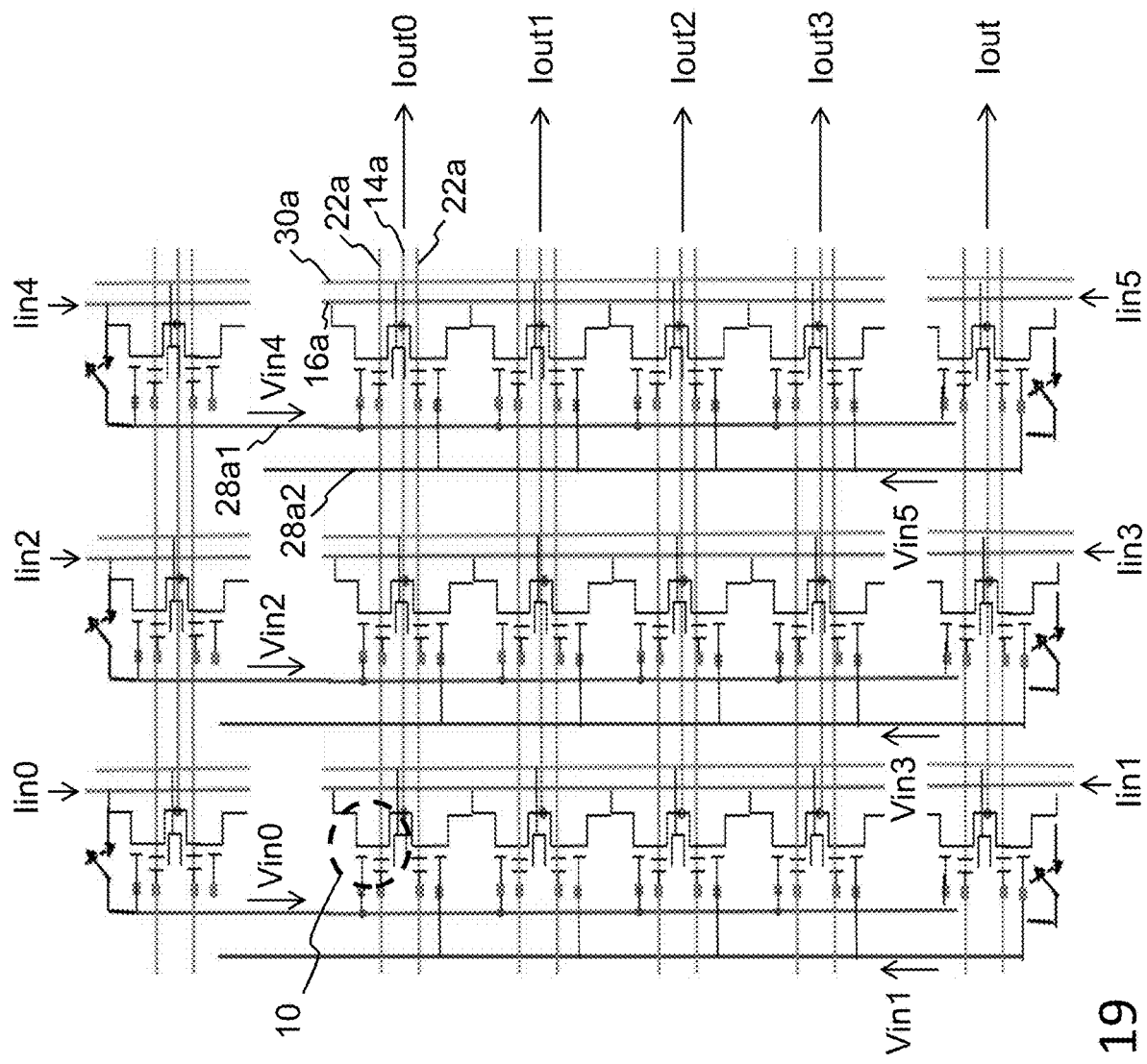
FIG. 19 is a schematic diagram illustrating a third architecture of an array of four-gate memory cells.

FIG. 19 illustrates another configuration of an array of four-gate memory cells (i.e., such as that shown in FIG. 6) arranged as a gate coupling/source summing matrix multiplier. The lines for the array of FIG. 19 are the same as that in FIGS. 15 and 16, except that the select gate lines 28a run vertically and there are two of them for each column of memory cells. Specifically, each column of memory cells include two select gate lines: a first select gate line 28a1 connecting together all the select gates 28 of the odd row memory cells, and a second select gate line 28a2 connecting together all the select gates 28 of the even row memory cells.

The circuits at the top and bottom of FIG. 19 serve to log convert the input currents Iin0 . . . IinN into the input voltages Vin0 . . . VinN. The matrix inputs shown in this figure are Vin0 . . . Vin5 and are placed on the select gate lines 28a1 and 28a2. Specifically, input Vin0 is placed on the select gate line 28a1 for the odd cells in column 1. Vin1 is placed on the select gate line 28a2 for the even cells in column 1. Vin2 is placed on the select gate line 28a1 for the odd cells in column 2. Vin3 is placed on the select gate line 28a2 for the even cells in column 2, and so on. The matrix outputs Iout0 . . . Iout3 are provided on the source lines 14a. The bit lines 16a are biased at fixed bias voltage VBLrd. Each output Iout is a sum of the cell current I times the weight W stored in the cell, for all the cells in that row of memory cells. Therefore, for this architecture, each row of memory cells acts as a single synapse having a weight value expressed as output current Iout dictated by the sum of the weight values stored in the memory cells in that row.

Figure 20:
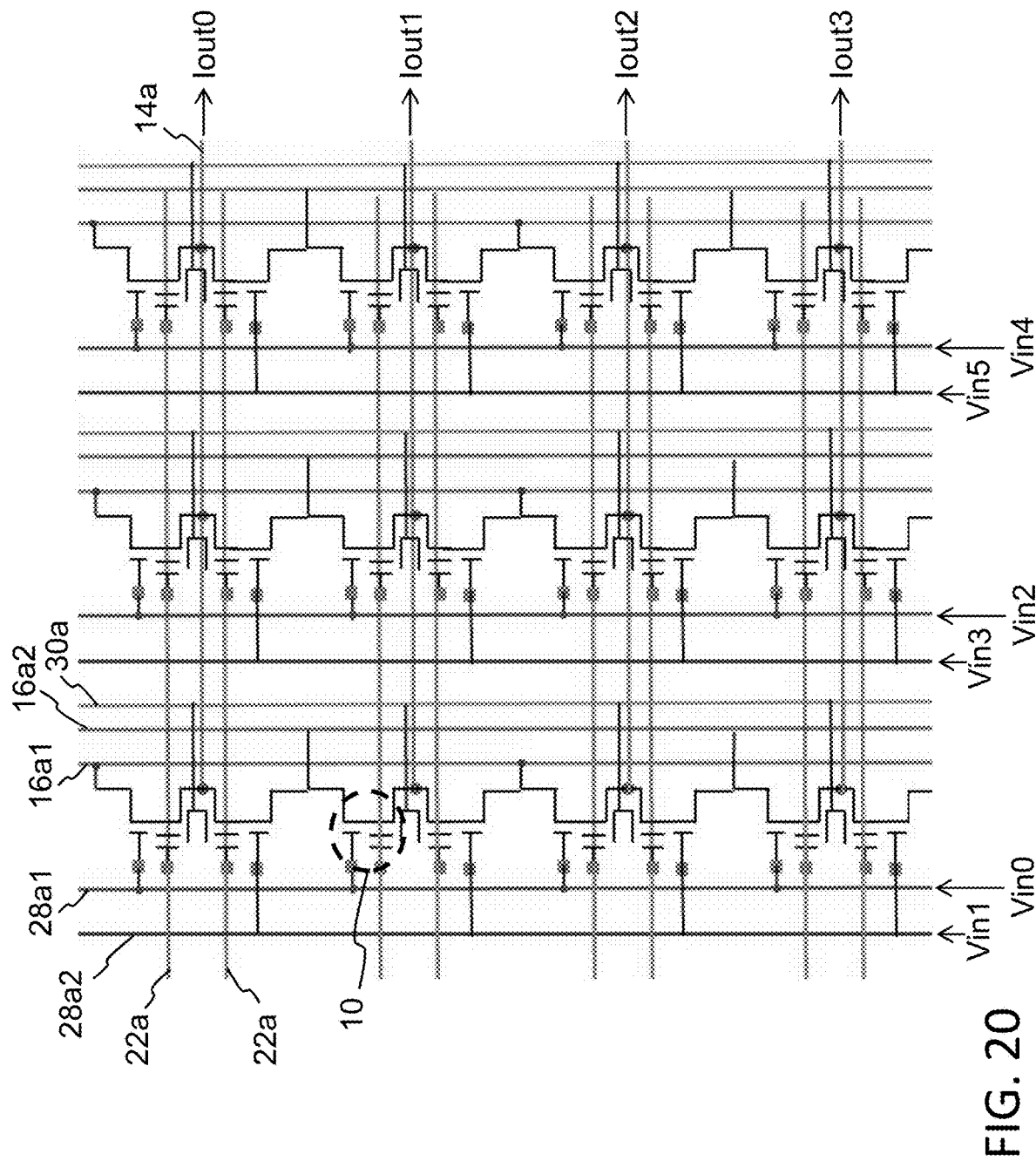
FIG. 20 is a schematic diagram illustrating a fourth architecture of an array of four-gate memory cells.

FIG. 20 illustrates another configuration of an array of four-gate memory cells (i.e., such as that shown in FIG. 6) arranged as a gate coupling/source summing matrix multiplier. The lines for the array of FIG. 20 are the same as that in FIG. 19, except that bit lines 16 run vertically and there are two of them for each column of memory cells. Specifically, each column of memory cells include two bit lines: a first bit line 16a1 connecting together all the drain regions of the adjacent twin memory cells (two memory cells sharing the same bit line contact), and a second bit line 16a2 connecting together all the drain regions of the next adjacent twin memory cells. The matrix inputs Vin0 . . . VinN remain on select gate lines 28a1 and 28a2, and the matrix outputs Iout0 . . . IoutN remain on the source lines 14a. The set of all the first bit lines 16a1 are biased at a bias level, e.g., 1.2v, and the set of all the second bit lines 16a2 are biased at another bias level, e.g., 0v. The source lines 14a are biased at a virtual bias level, e.g., 0.6v. For each pair of memory cells sharing a common source line 14a, the output current will be a differential output of the top cell minus the bottom cell. Therefore, each output Iout is a sum of these differential outputs:

$$Iout=\Sigma(Iiju*Wiju-Iijd*Wijd)$$

$$SL \text{ voltage} \sim \tfrac{1}{2}Vdd, \sim 0.5v$$

Therefore, for this architecture, each row of paired memory cells acts as a single synapse having a weight value expressed as output current Iout which is the sum of differential outputs dictated by the weight values stored in the memory cells in that row of paired memory cells.

Figure 21:
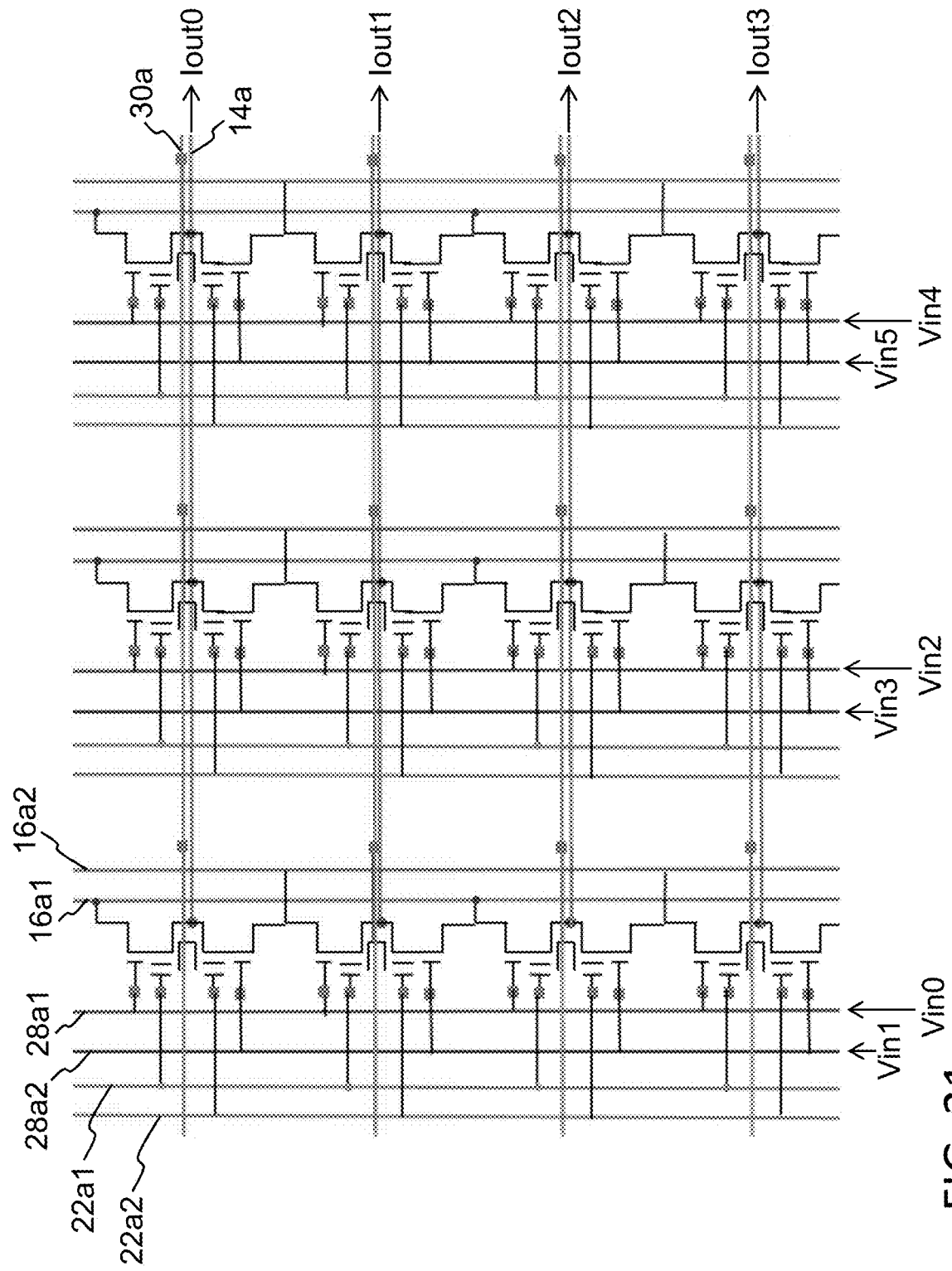
FIG. 21 is a schematic diagram illustrating a fifth architecture of an array of four-gate memory cells.

FIG. 21 illustrates another configuration of an array of four-gate memory cells (i.e., such as that shown in FIG. 6) arranged as a gate coupling/source summing matrix multiplier. The lines for the array of FIG. 21 are the same as that in FIG. 20, except that the erase gates 30a run horizontally, and the control gate lines 22a run vertically and there are two of them for each column of memory cells. Specifically, each column of memory cells include two control gate lines: a first control gate line 22a1 connecting together all the control gates 22a of the odd row memory cells, and a second control gate line 22a2 connecting together all the control gates 22a of the even row memory cells. The matrix inputs Vin0 . . . VinN remain on select gate lines 28a1 and 28a2, and the matrix outputs Iout0 . . . IoutN remain on the source lines 14a.

Figure 22:
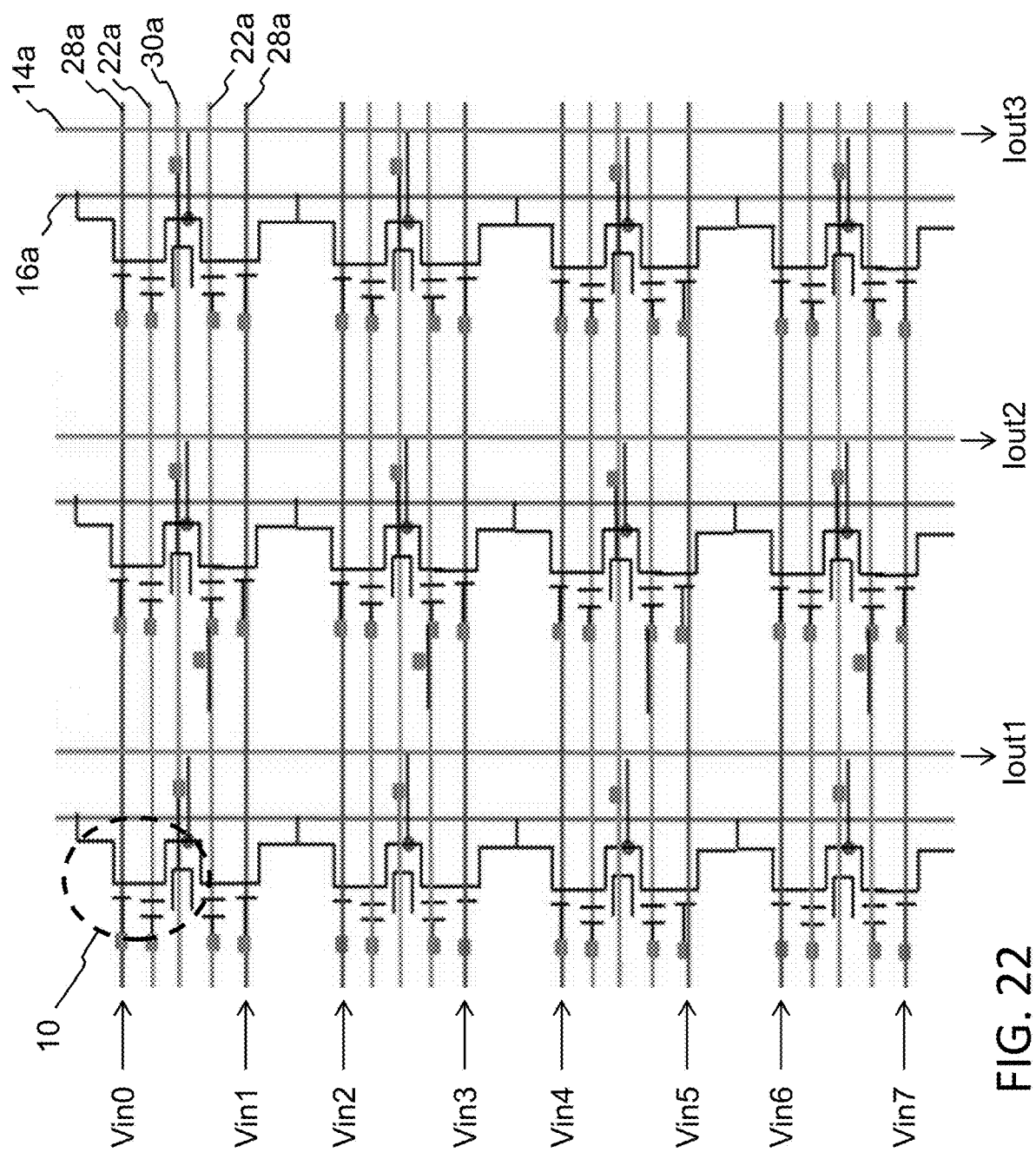
FIG. 22 is a schematic diagram illustrating a sixth architecture of an array of four-gate memory cells.

FIG. 22 illustrates another configuration of an array of four-gate memory cells (i.e., such as that shown in FIG. 6) arranged as a source summing matrix multiplier. The lines and inputs for the array of FIG. 22 are the same as that in FIG. 17. However, instead of the outputs being provided on the bit lines 16a, they are provided on the source lines 14a. The matrix inputs Vin0 . . . VinN remain on select gate lines 28a.

Figure 1:
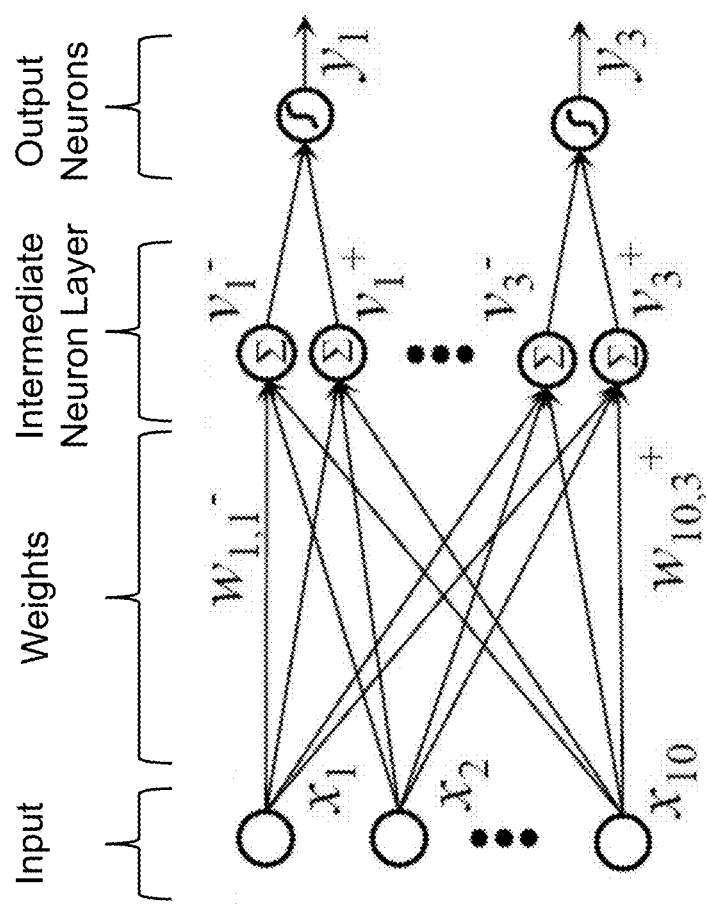
FIG. 1 is a diagram that illustrates an artificial neural network.
Figure 23:
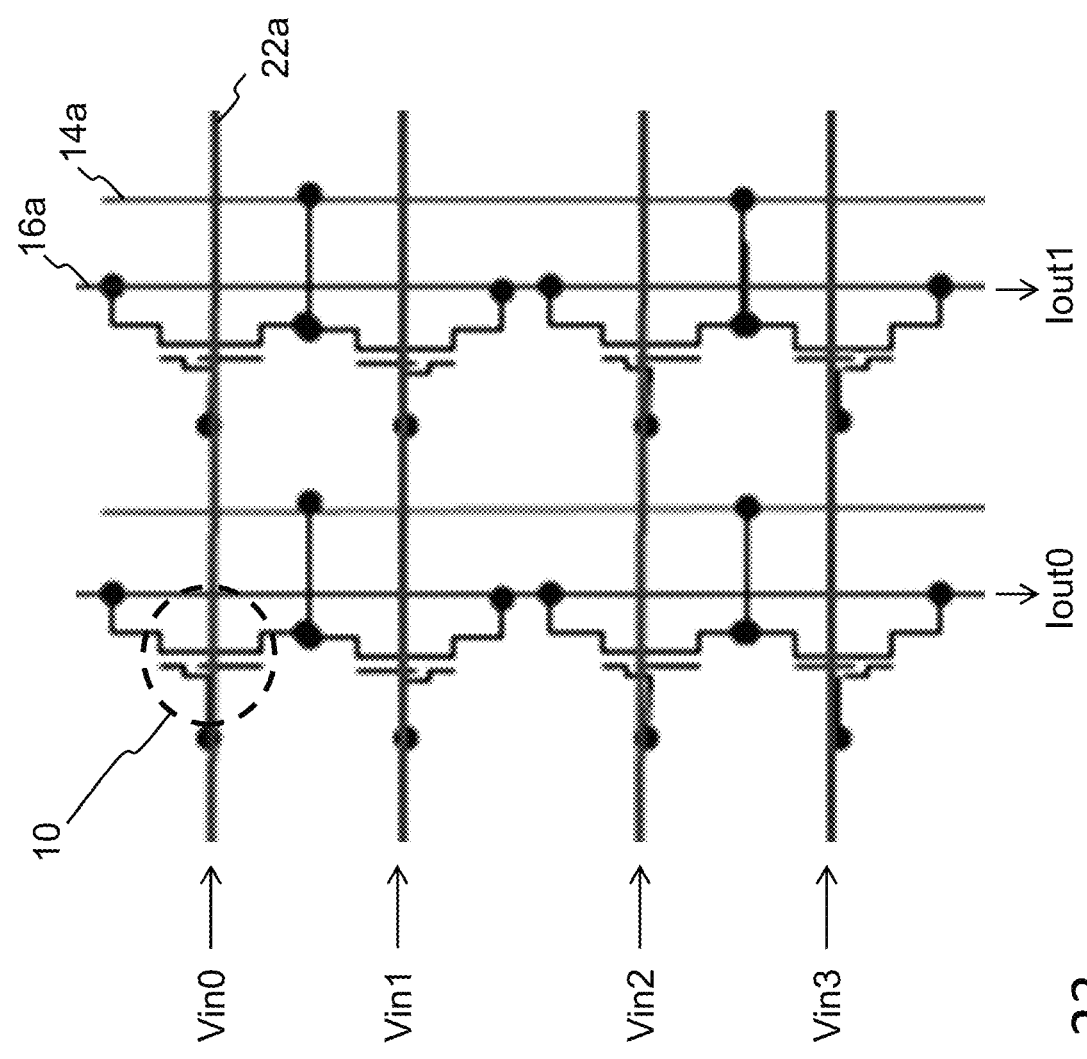
FIG. 23 is a schematic diagram illustrating a first architecture of an array of two-gate memory cells.

FIG. 23 illustrates a configuration of an array of two-gate memory cells (i.e., such as that shown in FIG. 1) arranged as a drain summing matrix multiplier. The lines for the array of FIG. 23 are the same as that in FIG. 5, except that the horizontal source lines 14a have been replaced with vertical source lines 14a. Specifically, each source line 14a is connected to all the source regions in that column of memory cells. The matrix inputs Vin0 . . . VinN are placed on the control gate lines 22a. The matrix outputs Iout0 . . . IoutN are produced on the bit lines 16a. Each output Iout is a sum of the cell current I times the weight W stored in the cell, for all the cells in the column. Each column of memory cells acts as a single synapse having a weight value expressed as output current Iout dictated by the sum of the weight values stored in the memory cells for that column.

Figure 24:
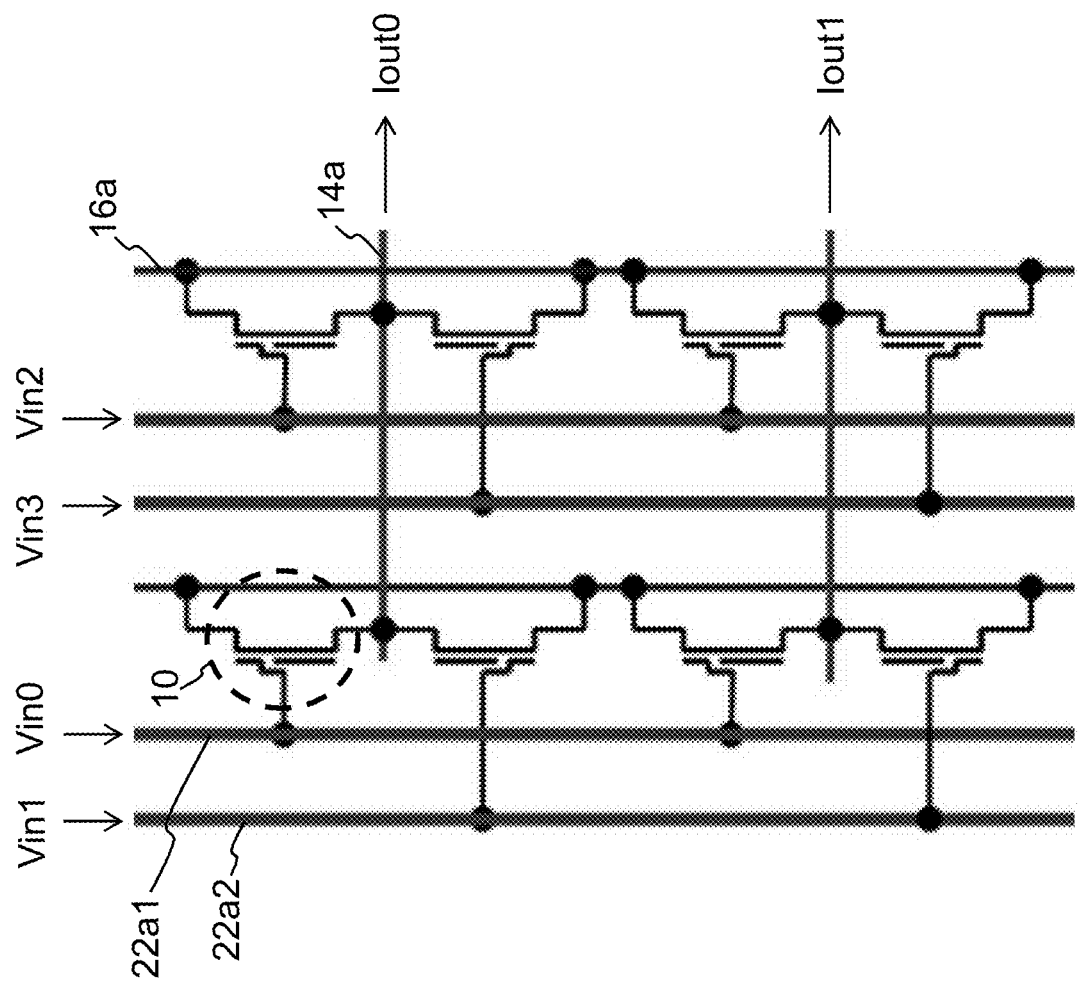
FIG. 24 is a schematic diagram illustrating a second architecture of an array of two-gate memory cells.

FIG. 24 illustrates a configuration of an array of two-gate memory cells (i.e., such as that shown in FIG. 1) arranged as a source summing matrix multiplier. The lines for the array of FIG. 24 are the same as that in FIG. 5, except that the control gate lines 22a run vertically and there are two of them for each column of memory cells. Specifically, each column of memory cells include two control gate lines: a first control gate line 22a1 connecting together all the control gates 22a of the odd row memory cells, and a second control gate line 22a2 connecting together all the control gates 22a of the even row memory cells.

The matrix inputs for this configuration are Vin0 . . . VinN and are placed on the control gate lines 22a1 and 22a2. Specifically, input Vin0 is placed on control gate line 22a1 for the odd row cells in column 1. Vin1 is placed on the control gate line 22a2 for the even row cells in column 1. Vin2 is placed on the control gate line 22a1 for the odd row cells in column 2. Vin3 is placed on the control gate line 22a2 for the even row cells in column 2, and so on. The matrix outputs Iout0 . . . IoutN are produced on the source lines 14a. For each pair of memory cells sharing a common source line 14a, the output current will be a differential output of the top cell minus the bottom cell. Therefore, for this architecture, each row of paired memory cells acts as a single synapse having a weight value expressed as output current Iout which is the sum of differential outputs dictated by the weight values stored in the memory cells in that row of paired memory cells.

Exemplary operational voltages for the embodiments of FIGS. 15-16, 19 and 20 include:

|  | EG | | WL | | CG | | BL | | SL | |
| --- | --- | --- | --- | --- | --- | --- | --- | --- | --- | --- |
|  | sel | unsel | sel | unsel | sel | unsel | sel | unsel | sel | unsel |
| Erase | VEGerase | gnd | gnd | gnd | gnd | VCGerinhibit | gnd | gnd | gnd | gnd |
| Program | VEGprg/gnd | gnd | VWLprg | gnd | VCGprg | gnd | Iprog | VBLprginh | VSprg | gnd |
| Read | gnd | gnd | VWLrd | gnd | VCGrd | gnd | VBLrd | gnd | VSrd | float/gnd |

| Approximate numerical values include: | |
| --- | --- |
| VEGerase | 8-11.5 v |
| VCGerinhibit | 3.5-8 v |
| VEGprg | 4-6 v |
| VWLprg | 0.8-1.2 v |
| VCGprg | 6-10 v |
| VBLprginh | 1-2.5 v |
| Iprog | 0.2-1 μa |
| VSprg | 3-5 V |
| VWLrd | 0.4-2.0 V |
| VCGrd | 0-2.5 V |
| VBLrd | 1-2 V |
| VSrd | 0-0.6 V |

Exemplary operational voltages for the embodiments of FIGS. 17-18 and 22 include:

|  | EG | | WL | | CG | | | BL | | SL | |
| --- | --- | --- | --- | --- | --- | --- | --- | --- | --- | --- | --- |
|  | sel | unsel | sel | unsel | sel | unsel-shared EG | unsel | sel | unsel | sel | unsel |
| Erase | VEGerase | gnd | gnd | gnd | gnd | VCGerinh | gnd | gnd | VBLerinh/gnd | VSLerinh | gnd |
| Program | VEGprg/gnd | gnd | VWLprg | gnd | VCGprg/gnd | gnd | gnd | Iprog | VBLprginh | VSprg | gnd |
| Read | gnd | gnd | VWLrd | gnd | VCGrd | gnd | gnd | VBLrd | gnd | VSrd | float/gnd |

| Approximate numerical values include: | |
| --- | --- |
| VEGerase | 7-10 v |
| VSLerinh | 3.5-6 v |
| VCGerinh | 3.5-7 v |
| VBLerinh | 1-2.5 v |

-continued

| Approximate numerical values include: | |
|---|---|
| VEGprg | 4-6 v |
| VWLprg | 0.8-1.2 v |
| VCGprg | 6-10 v |
| VBLprginh | 1-2.5 v |
| Iprog | 0.2-1 µa |
| VSprg | 3-5 V |
| VWLrd | 0.4-2.0 V |
| VCGrd | 1-2.5 V |
| VBLrd | 1-2 V |
| VSrd | 0-0.6 V |

Figure 25:
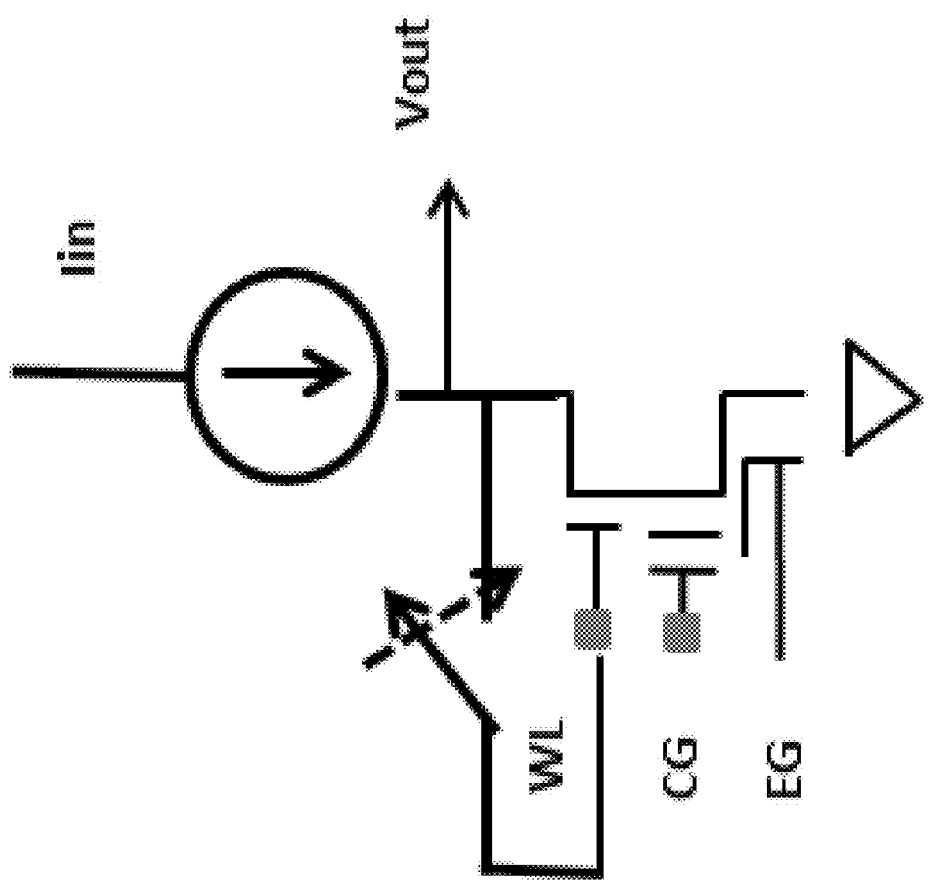
FIG. 25 is a diagram illustrating a current-to-voltage log converter.
Figure 26:
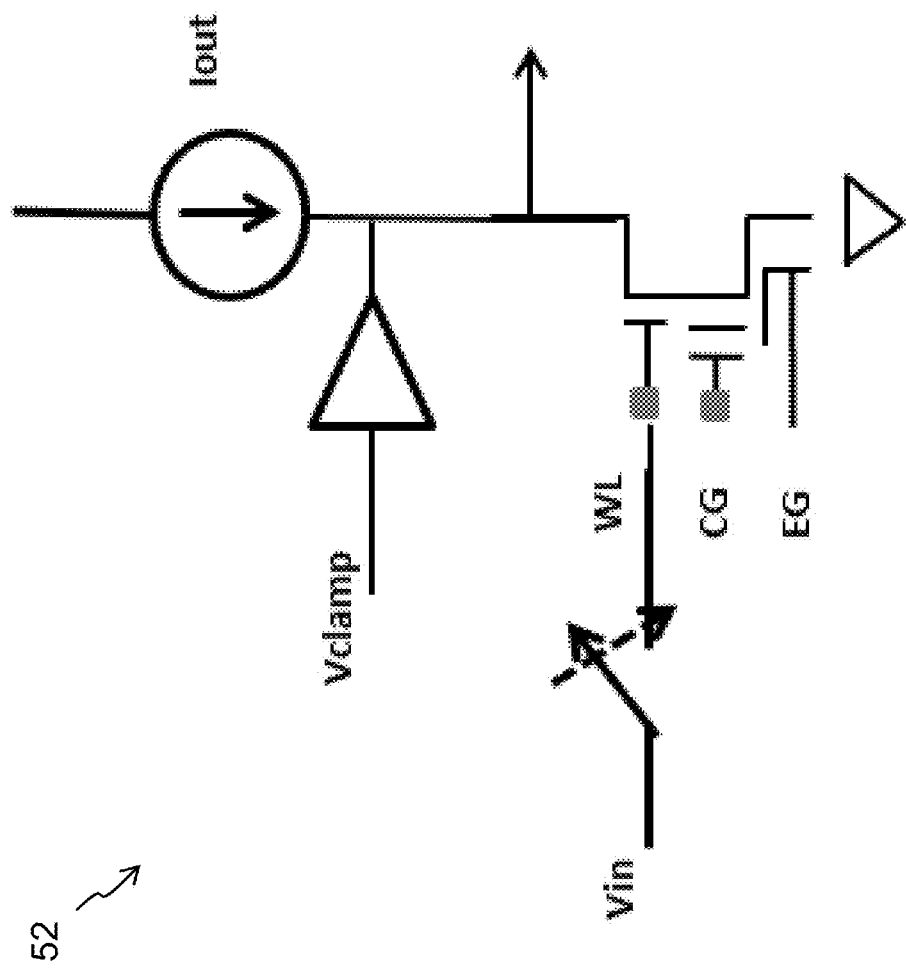
FIG. 26 is a diagram illustrating a voltage-to-current log converter.
Figure 27:
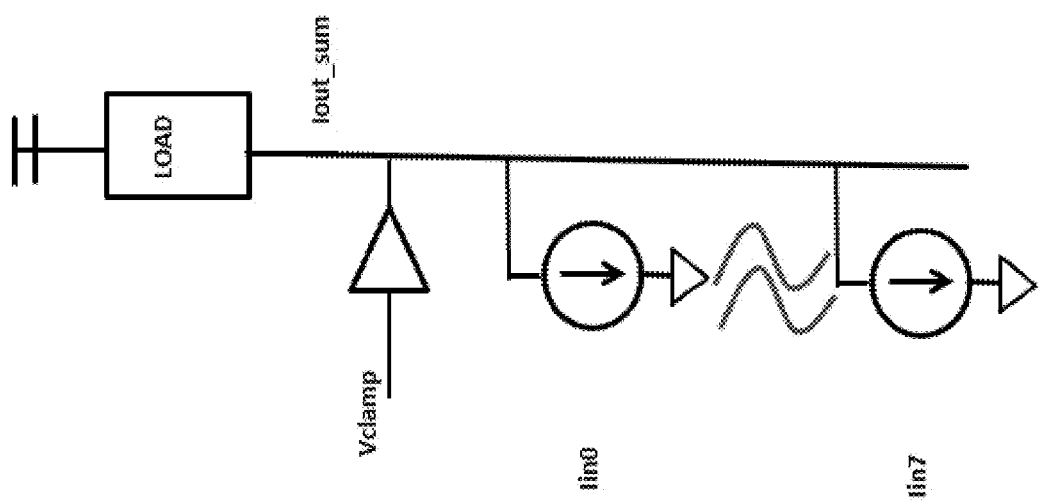
FIG. 27 is a diagram illustrating a Gnd-referred current summer.
Figure 28:
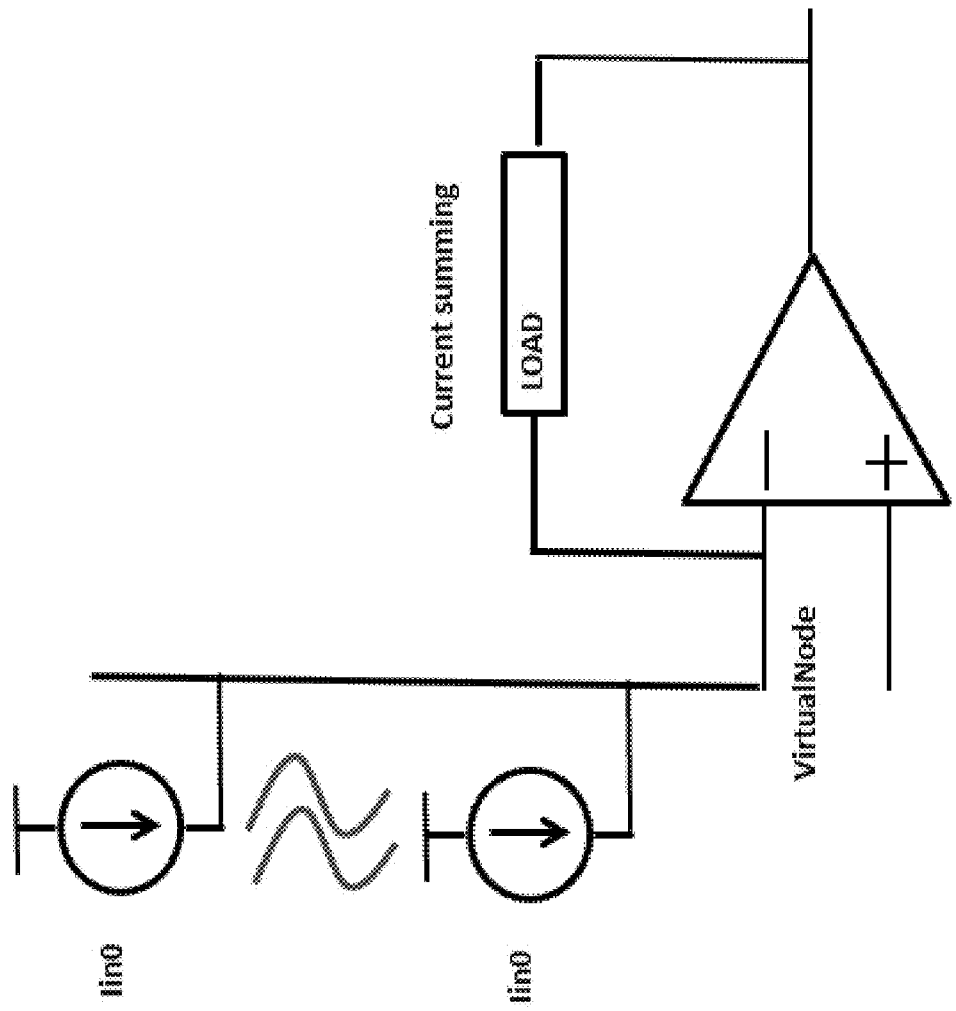
FIG. 28 is a diagram illustrating a Vdd-referred current summer.

FIG. 25 illustrates an exemplary current to voltage log converter 50 for use with the present invention (WL=select gate line, CG=control gate line, EG=erase gate line). The memory is biased in a weak inversion region, Ids=Io* $e^{(Vg-Vth)/kVt}$. FIG. 26 illustrates an exemplary voltage to current log converter 52 for use with the present invention. The memory is biased in a weak inversion region. FIG. 27 illustrates a Gnd-referred current summer 54 for use with the present invention. FIG. 28 below illustrates a Vdd-referred current summer 56 for use with the present invention. Examples of the load include a diode, a non-volatile memory cell, and a resistor.

The above described memory array configurations implement a feed-forward classification-engine. The training is completed by storing "weight" values in the memory cells (creating a synapse array), which means subthreshold-slope-factors of the individual cells have been modified. The neurons are implemented by summing the outputs of synapse and firing or not firing depending on the neuron threshold (i.e., making a decision).

The following steps can be used to process input current IE (e.g. the input current is coming directly from the output of feature calculations for image recognition):

Step 1—Convert to log scale for easier processing with non-volatile memory.
  Input Current to voltage conversion using a bipolar transistor. Bias voltage $V_{BE}$ of a bipolar transistor has a logarithmic relationship with the emitter current.

$$VBE = a*1nI_E - b \rightarrow V_{BE} \propto \times 1nI_E$$

Where a (ratio) and b (bias or offset) are constants $V_{BE}$ voltage is generated such that the memory cells will be operated in the subthreshold region.

Step 2—Apply the generated bias voltage VBE to the word line (in subthreshold region).
  Output current $I_{DRAIN}$ of a CMOS transistor has an exponential relationship with the input voltage ($V_{GS}$), Thermal Voltage ($U_T$) and kappa (k=$C_{ox}$/($C_{ox}+C_{dep}$)), where $C_{ox}$ and $C_{dep}$ are linearly dependent on the charge on the floating gate.

$$I_{DRAIN} \propto Exp(kV_{BE}/U_T), OR.$$

$$1nI_{DRAIN} \propto kV_{BE}/U_T$$

Logarithmic of $I_{DRAIN}$ has a linear relationship with the multiple of $V_{BE}$ and charge on the floating gate (related to kappa), where $U_T$ is constant at a given temperature.
  An Output=Input*weights relationship exists for a synapse.

The output of each of the cells ($I_{DRAIN}$) could be tied together in the read mode to sum up the values of each synapse in the array or sector of the array. Once $I_{DRAIN}$ has been summed up, it can be fed into a current comparator, and output a "logic" 0 or 1 depending on the comparison for a single perception neural network. One perception (one sector) is described above. The output from each perception can be fed to the next set of sectors for multiple perceptions.

Figure 29:
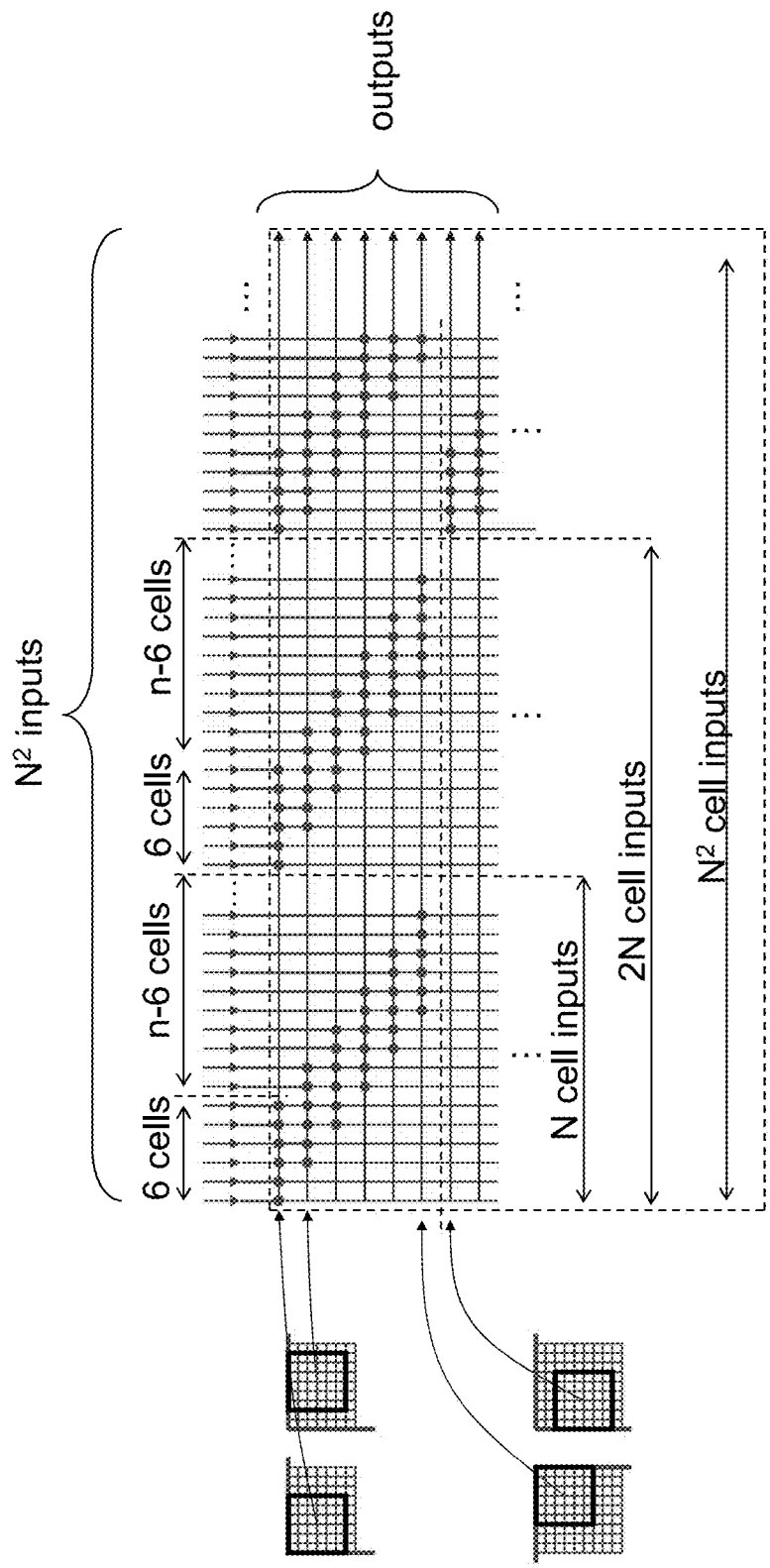
FIG. 29 is a diagram illustrating the utilization of $N^2$ neural net inputs of a non-volatile memory array.

In a memory based Convolutional Neural Network, a set of inputs needs to be multiplied with certain weights to produce a desired result for a hidden layer or output layer. As explained above, one technique is to scan the preceding image (for example an N×N matrix) using an M×M filter (kernel) that is shifted by X pixels across the image in both horizontal and vertical directions. The scanning of the pixels can be done at least partially concurrently so long as there are enough inputs to the memory array. For example, as shown in FIG. 29, a filter size of M=6 (i.e., a 6×6 array of 36 pixels) can be used to scan an N×N image array, using shifts of X=2. In that example, the first row of six pixels in the filter is provided to the first 6 of the inputs to the memory array of $N^2$ inputs. Then, the second row of six pixels in the filter is provided to the first 6 of the inputs in the second N inputs of the $N^2$ inputs, and so on. This is represented in the first row of the diagram in FIG. 29, where the dots represent the weights stored in the memory array for multiplication by the inputs as set forth above. Then, the filter is shifted to the right by two pixels, and the first row of six pixels in the shifted filter is provided to the third through the eighth inputs of the first N inputs, the second row of six pixels is provided to the third through the eight inputs of the second N inputs, and so on. Once the filter is shifted all the way to the right side of the image, the filter is repositioned back to the left side, but shifted down by two pixels, where the process repeats again, until the entire N×N image is scanned. Each set of horizontally shifted scans can be represented by trapezoidal shapes showing which of the $N^2$ memory array inputs are provided with data for multiplication.

Figure 30:
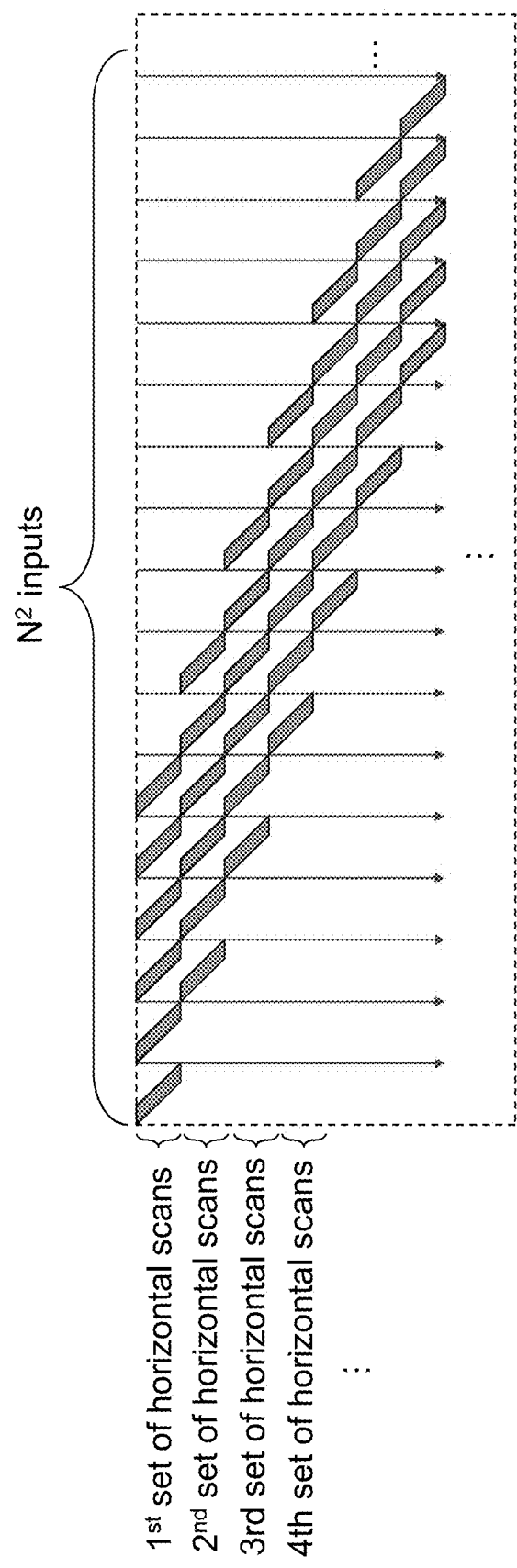
FIG. 30 is a diagram illustrating the utilization of $N^2$ neural net inputs of a non-volatile memory array.

Accordingly, a scan of N×N image array, using a shift of two pixels between scans, and a filter size of 6×6, requires $N^2$ inputs and ((N−4)/2)) 2 rows. FIG. 30 graphically shows the trapezoidal shapes indicating how the weights in the memory array are stored for the filter scan. Each row of shaded areas represents weights being applied to the inputs during one set of the horizontal scans. The arrows indicate linear input lines of the memory array (e.g., the input lines 28a in FIG. 15 that receive the input data extend all the way across the memory array in a linear manner, each one always accessing the same row of memory cells; in the case of the array of FIG. 19, each of the input lines always access the same column of memory cells). The white areas indicate where no data is being supplied to the inputs. Therefore, the white areas are indicative of inefficient use of the memory cell array.

Figure 31:
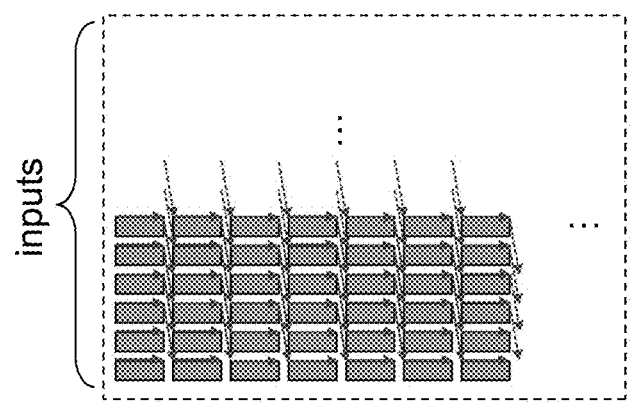
FIG. 31 is a diagram illustrating the utilization of neural net inputs of a non-volatile memory array having periodically shifting input lines.

Efficiency can be increased, and the total number of inputs reduced, by reconfiguring the memory arrays as shown in FIG. 31. Specifically, the input lines of the memory array are shifted periodically to another row or column, thus reducing the unused portions of the array, and therefore reducing the number of repeated input lines over the array needed to perform the scan. Specifically, in the case of the present example where the shift X=2, the arrows indicate that each input line periodically shifts over by two rows or two columns, transforming the widely spaced apart memory cell utilization trapezoidal shapes to closely spaced memory cell utilization rectangular shapes. While extra space between memory cell portions are needed for wire bundles to implement this shift, the number of inputs needed in the memory cell array is greatly reduced (only 5n+6).

Figure 32:
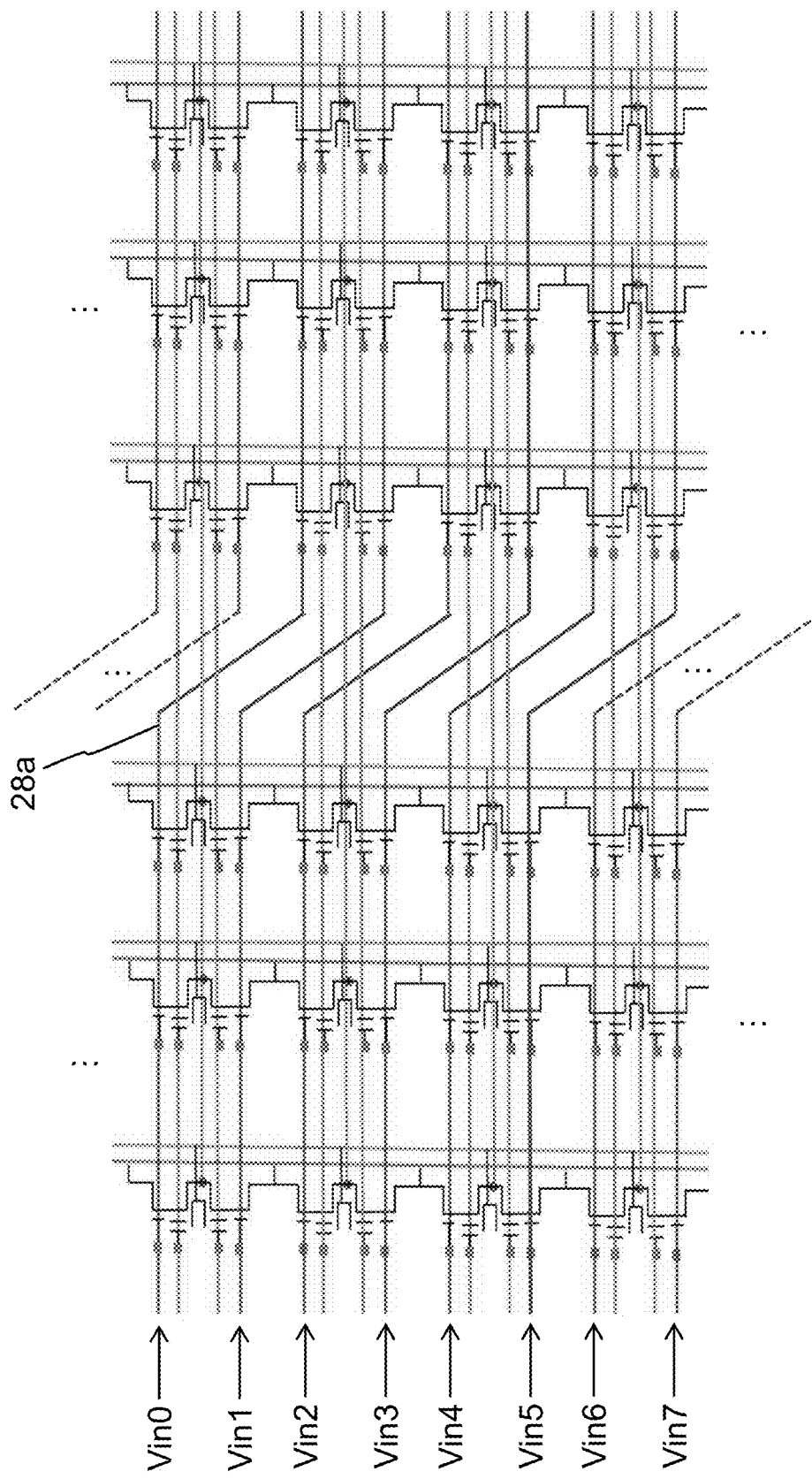
FIG. 32 is a schematic diagram illustrating memory array architecture of FIG. 15, but with periodically shifting input lines.
Figure 33:
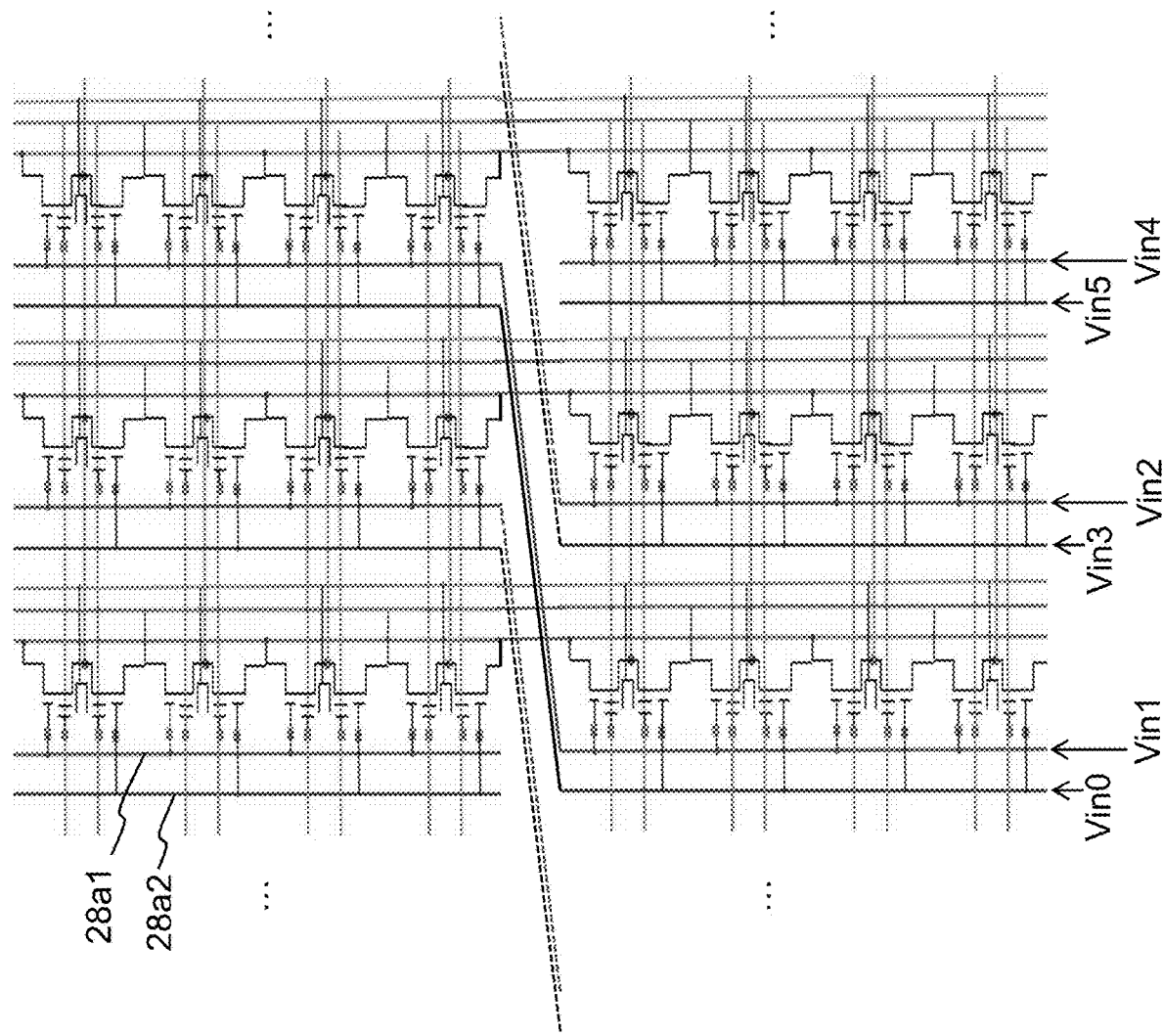
FIG. 33 is a schematic diagram illustrating memory array architecture of FIG. 20, but with periodically shifting input lines.

FIG. 32 illustrates the array of FIG. 15, but with periodic shifts of two rows for lines 28a used as the input lines. The periodic shift in rows for the input lines can be similarly implemented in the arrays of FIGS. 17, 22 and 23. FIG. 33 illustrates the array of FIG. 20, but with periodic shifts of two columns for lines 28a1 and 28a2 used as the input lines. The periodic shift in column for the input lines can be similarly implemented in the arrays of FIGS. 19, 21 and 24.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Single layers of material could be formed as multiple layers of such or similar materials, and vice versa. While the outputs of each memory cell array are manipulated by filter condensation before being sent to the next neuron layer, they need not be.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A memory device, comprising:
    a plurality of non-volatile memory cells arranged in rows and columns, having source regions arranged in rows and columns, and drain regions arranged in rows and columns, wherein respective ones of the columns of drain regions include first drain regions and second drain regions that alternate with each other;
    respective ones of the plurality of non-volatile memory cells comprise:
        a channel region extending between one of the source regions and one of the drain regions,
        a floating gate disposed over and insulated from a first portion of the channel region, and
        a first non-floating gate disposed over and insulated from a second portion of the channel region;
    a plurality of first lines, wherein respective ones of the plurality of first lines electrically connect together the source regions in one of the rows of the source regions and are physically isolated from the source regions in other rows of the source regions;
    a plurality of second lines, wherein respective ones of the plurality of second lines electrically connect together the first drain regions of one of the columns of drain regions and are physically isolated from the second drain regions of the one column of drain regions;
    a plurality of third lines, wherein respective ones of the plurality of third lines electrically connect together the second drain regions of one of the columns of drain regions and are physically isolated from the first drain regions of the one column of drain regions;
    a plurality of fourth lines, wherein respective ones of the plurality of fourth lines electrically connect together the first non-floating gates of odd row memory cells in one of the columns of the memory cells and are physically isolated from the first non-floating gates of even row memory cells in the one column of the memory cells; and
    a plurality of fifth lines, wherein respective ones of the plurality of fifth lines electrically connect together the first non-floating gates of even row memory cells in one of the columns of the memory cells and are physically isolated from the first non-floating gates of odd row memory cells in the one column of the memory cells.

2. The memory device of claim 1, wherein for respective ones of the columns of drain regions:
    the second line is physically isolated from the drain regions in other columns of the drain regions; and
    the third line is physically isolated from the drain regions in other columns of the drain regions.

3. The memory device of claim 1, wherein for respective ones of the columns of the memory cells:
    the fourth line is physically isolated from the first non-floating gates in other columns of the memory cells; and
    the fifth line is physically isolated from the first non-floating gates in other columns of the memory cells.

4. The memory device of claim 1, wherein respective ones of the plurality of non-volatile memory cells comprise a second non-floating gate disposed over and insulated from the floating gate, the memory device comprising:
    a plurality of sixth lines, wherein respective ones of the plurality of sixth lines electrically connect together the second non-floating gates in one of the rows of the memory cells.

5. The memory device of claim 1, wherein respective ones of the plurality of non-volatile memory cells comprise a second non-floating gate disposed over and insulated from the source region, the memory device further comprising:
    a plurality of sixth lines, wherein respective ones of the plurality of sixth lines electrically connect together the second non-floating gates in one of the columns of the memory cells.

6. The memory device of claim 1, wherein respective ones of the plurality of non-volatile memory cells comprise a second non-floating gate disposed over and insulated from the floating gate and a third non-floating gate disposed over and insulated from the source region, the memory device comprising:
    a plurality of sixth lines, wherein respective ones of the plurality of sixth lines electrically connect together the second non-floating gates in one of the rows of the memory cells; and
    a plurality of seventh lines, wherein respective ones of the plurality of seventh lines electrically connect together the third non-floating gates in one of the columns of the memory cells.

7. The memory device of claim 1, wherein respective ones of the plurality of non-volatile memory cells comprise a second non-floating gate disposed over and insulated from the floating gate, the memory device comprising:
- a plurality of sixth lines, wherein respective ones of the plurality of sixth lines electrically connect together the second non-floating gates of odd row memory cells in one of the columns of the memory cells; and
- a plurality of seventh lines, wherein respective ones of the plurality of seventh lines electrically connect together the second non-floating gates of even row memory cells in one of the columns of the memory cells.

8. The memory device of claim 1, wherein respective ones of the plurality of non-volatile memory cells comprise a second non-floating gate disposed over and insulated from the source region, the memory device comprising:
- a plurality of sixth lines, wherein respective ones of the plurality of sixth lines electrically connect together the second non-floating gates in one of the rows of the memory cells.

9. The memory device of claim 1, wherein respective ones of the plurality of non-volatile memory cells comprise a second non-floating gate disposed over and insulated from the floating gate and a third non-floating gate disposed over and insulated from the source region, the memory device comprising:
- a plurality of sixth lines, wherein respective ones of the plurality of sixth lines electrically connect together the second non-floating gates of odd row memory cells in one of the columns of the memory cells;
- a plurality of seventh lines, wherein respective ones of the plurality of seventh lines electrically connect together the second non-floating gates of even row memory cells in one of the columns of the memory cells; and
- a plurality of eighth lines, wherein respective ones of the plurality of eighth lines electrically connect together the third non-floating gates in one of the rows of the memory cells.

10. A memory device, comprising:
- a plurality of memory cells arranged in rows and columns, wherein each column of the memory cells comprises:
  - a plurality of alternating source and drain regions formed in a semiconductor substrate, with two channel regions of the semiconductor substrate extending from each of the source regions to an adjacent two of the drain regions respectively, wherein the drain regions include first drain regions and second drain regions that alternate with each other;
  - a plurality of floating gates each disposed over and insulated from a first portion of one of the channel regions, and
  - a plurality of first non-floating gates each disposed over and insulated from a second portion of one of the channel regions;
- wherein the source regions are arranged in rows and columns; and
- a plurality of first lines each electrically connecting together the source regions in one of the rows of the source regions and physically isolated from the source regions in other rows of the source regions;
- wherein for each one of the columns of memory cells, the memory device further comprising:
  - a second line electrically connecting together the first drain regions of the one column and physically isolated from the second drain regions of the one column,
  - a third line electrically connecting together the second drain regions of the one column and physically isolated from the first drain regions of the one column,
  - a fourth line electrically connecting together the first non-floating gates of odd row memory cells of the one column, and
  - a fifth line electrically connecting together the first non-floating gates of even row memory cells of the one column.

11. The memory device of claim 10, wherein for each one of the columns of memory cells:
- the second line is physically isolated from the drain regions in other columns of the memory cells; and
- the third line is physically isolated from the drain regions in other columns of the memory cells.

12. The memory device of claim 10, wherein each of the memory cells comprises a second non-floating gate disposed over and insulated from the floating gate, the memory device further comprising:
- a plurality of sixth lines each electrically connecting together the second non-floating gates in one of the rows of the memory cells.

13. The memory device of claim 10, wherein each of the memory cells comprises a second non-floating gate disposed over and insulated from the source region, the memory device further comprising:
- a plurality of sixth lines each electrically connecting together the second non-floating gates in one of the columns of the memory cells.

14. The memory device of claim 10, wherein for each one of the columns of the memory cells:
- the fourth line is physically isolated from the first non-floating gates in other columns of the memory cells; and
- the fifth line is physically isolated from the first non-floating gates in other columns of the memory cells.

15. The memory device of claim 10, wherein each of the memory cells comprises a second non-floating gate disposed over and insulated from the floating gate and a third non-floating gate disposed over and insulated from the source region, the memory device further comprising:
- a plurality of sixth lines each electrically connecting together the second non-floating gates in one of the rows of the memory cells; and
- a plurality of seventh lines each electrically connecting together the third non-floating gates in one of the columns of the memory cells.

16. The memory device of claim 10, wherein each of the memory cells comprises a second non-floating gate disposed over and insulated from the floating gate and a third non-floating gate disposed over and insulated from the source region, the memory device further comprising:
- a plurality of sixth lines each electrically connecting together the second non-floating gates in one of the rows of the memory cells;
- a plurality of seventh lines each electrically connecting together the third non-floating gates in one of the columns of the memory cells.

17. The memory device of claim 10, wherein each of the memory cells comprises a second non-floating gate disposed over and insulated from the floating gate, the memory device further comprising:
- a plurality of sixth lines each electrically connecting together the second non-floating gates of odd row memory cells in one of the columns of the memory cells; and a plurality of seventh lines each electrically connecting together the second non-floating gates of even row memory cells in one of the columns of the memory cells.

18. The memory device of claim 10, wherein each of the memory cells comprises a second non-floating gate disposed over and insulated from the source region, the memory device further comprising:
   a plurality of sixth lines each electrically connecting together the second non-floating gates in one of the rows of the memory cells.

19. The memory device of claim 10, wherein each of the memory cells comprises a second non-floating gate disposed over and insulated from the floating gate and a third non-floating gate disposed over and insulated from the source region, the memory device further comprising:
   a plurality of sixth lines each electrically connecting together the second non-floating gates of odd row memory cells in one of the columns of the memory cells;
   a plurality of seventh lines each electrically connecting together the second non-floating gates of even row memory cells in one of the columns of the memory cells; and
   a plurality of eighth lines each electrically connecting together the third non-floating gates in one of the rows of the memory cells.

20. The memory device of claim 10, wherein each of the memory cells comprises a second non-floating gate disposed over and insulated from the floating gate and a third non-floating gate disposed over and insulated from the source region, the memory device further comprising:
   a plurality of sixth lines each electrically connecting together the second non-floating gates of odd row memory cells in one of the columns of the memory cells;
   a plurality of seventh lines each electrically connecting together the second non-floating gates of even row memory cells in one of the columns of the memory cells; and
   a plurality of eighth lines each electrically connecting together the third non-floating gates in one of the rows of the memory cells.

* * * * *